US009876360B2

(12) United States Patent
Kravitz et al.

(10) Patent No.: US 9,876,360 B2
(45) Date of Patent: Jan. 23, 2018

(54) INTERFACE FOR RENEWABLE ENERGY SYSTEM

(71) Applicant: Technology Research, LLC, Clearwater, FL (US)

(72) Inventors: Arnold Kravitz, St. Petersburg, FL (US); Aldo P. Della Sera, Clearwater, FL (US)

(73) Assignee: Technology Research, LLC, Clearwater, FL (US)

( * ) Notice: Subject to any disclaimer, the term of this patent is extended or adjusted under 35 U.S.C. 154(b) by 167 days.

(21) Appl. No.: 14/612,159

(22) Filed: Feb. 2, 2015

(65) Prior Publication Data
US 2016/0226252 A1    Aug. 4, 2016

(51) Int. Cl.
*H02J 1/00*    (2006.01)
*H02J 3/00*    (2006.01)
(Continued)

(52) U.S. Cl.
CPC ............. *H02J 3/382* (2013.01); *G01K 13/00* (2013.01); *G01R 29/26* (2013.01); *H02J 3/383* (2013.01);
(Continued)

(58) Field of Classification Search
CPC .......... H02S 10/00; H02S 40/00; H02S 50/10; H02J 3/382; H02J 3/383; H02J 3/386;
(Continued)

(56) References Cited

U.S. PATENT DOCUMENTS 6,111,767 A * 8/2000 Handleman ............... G05F 1/67
136/293
6,429,546 B1 * 8/2002 Ropp ........................ H02J 3/01
307/31
(Continued)

FOREIGN PATENT DOCUMENTS

CA    2906590 A1    9/2014
CN    104158394 A    11/2014
(Continued)

OTHER PUBLICATIONS

International Searching Authority, International Search Report and Written Opinion for International Application No. PCT/US2016/016059, dated Jun. 27, 2016, 14 pages, The Netherlands.
(Continued)

*Primary Examiner* — Carlos Amaya
(74) *Attorney, Agent, or Firm* — Alston & Brid LLP

(57) ABSTRACT

An improved micro-inverter apparatus is disclosed for intelligently controlling energy harvest from photovoltaic solar panels based on one or more adjustable, user-defined variables. The improved micro-inverter apparatus may include a microcontroller configured to monitor the operating temperature of its micro-inverter and control the power harvested from associated solar panels in order to ensure the operating temperature of the micro-inverter does not approach a level that would damage the micro-inverter's circuitry or other components. Similarly, the micro-inverter apparatuses' microcontroller may be configured to monitor the total harmonic distortion of the micro-inverter's AC power output and control the power harvested from associated solar panels in order to ensure the total harmonic distortion of the AC power output does not exceed a threshold level.

16 Claims, 24 Drawing Sheets

(51) Int. Cl.
*H02J 3/38* (2006.01)
*H02M 7/537* (2006.01)
*H02S 50/10* (2014.01)
*G01R 29/26* (2006.01)
*G01K 13/00* (2006.01)
*H02M 7/00* (2006.01)
*H02M 1/32* (2007.01)

(52) U.S. Cl.
CPC .............. *H02J 3/386* (2013.01); *H02M 7/003* (2013.01); *H02M 7/537* (2013.01); *H02S 50/10* (2014.12); *H02M 1/32* (2013.01); *H02M 2001/327* (2013.01); *Y02B 10/14* (2013.01); *Y02E 10/563* (2013.01)

(58) Field of Classification Search
CPC ....... G01K 13/00; G01R 29/26; H02M 7/003; H02M 7/537
USPC .......................................................... 307/82
See application file for complete search history.

(56) References Cited

U.S. PATENT DOCUMENTS

| | | | |
|---|---|---|---|
| 8,106,537 B2 | 1/2012 | Casey et al. | |
| 8,134,820 B1 | 3/2012 | Riccio et al. | |
| 8,410,950 B2 | 4/2013 | Takehara et al. | |
| 8,435,056 B2 | 5/2013 | Fornage et al. | |
| 8,472,220 B2 | 6/2013 | Garrity et al. | |
| 8,626,616 B2 | 1/2014 | Eich | |
| 9,165,275 B2 | 10/2015 | Fornage | |
| 2008/0285317 A1 | 11/2008 | Rotzoll | |
| 2010/0134959 A1* | 6/2010 | Fife .................. | H05K 7/20945 361/678 |
| 2010/0263704 A1 | 10/2010 | Fornage et al. | |
| 2010/0307479 A1 | 12/2010 | Park | |
| 2011/0090089 A1 | 4/2011 | Luo | |
| 2011/0202181 A1 | 8/2011 | Lee et al. | |
| 2011/0225904 A1 | 9/2011 | Railkar et al. | |
| 2011/0273016 A1 | 11/2011 | Adest et al. | |
| 2012/0019074 A1 | 1/2012 | Frolov et al. | |
| 2012/0081934 A1 | 4/2012 | Garrity et al. | |
| 2012/0084027 A1 | 4/2012 | Caine | |
| 2012/0089260 A1 | 4/2012 | Krohne et al. | |
| 2012/0138123 A1 | 6/2012 | Newdoll et al. | |
| 2012/0175955 A1 | 7/2012 | Carralero et al. | |
| 2012/0310427 A1 | 12/2012 | Williams et al. | |
| 2012/0313443 A1 | 12/2012 | Cheng et al. | |
| 2013/0002031 A1 | 1/2013 | Mulkey et al. | |
| 2013/0012061 A1 | 1/2013 | Rotzoll et al. | |
| 2013/0021006 A1 | 1/2013 | Fornage | |
| 2013/0113291 A1* | 5/2013 | Recker ............... | H05B 33/0803 307/80 |
| 2013/0241535 A1 | 9/2013 | Magnussen et al. | |
| 2013/0346054 A1 | 12/2013 | Mumtaz | |
| 2014/0077609 A1 | 3/2014 | Fornage | |
| 2014/0191583 A1 | 7/2014 | Chisenga et al. | |
| 2014/0265585 A1 | 9/2014 | Della Sera et al. | |

FOREIGN PATENT DOCUMENTS

| | | | |
|---|---|---|---|
| EP | 2973976 A2 | | 1/2016 |
| JP | 2001238466 A | * | 8/2001 |
| WO | WO 2012/170726 A2 | | 12/2012 |
| WO | WO 2014/152765 A2 | | 9/2014 |

OTHER PUBLICATIONS

Microchip Technology Inc., "Grid-Connected Solar Microinverter Reference Design Using a dsPIC® Digital Signal Controller", AN1338 Technical Bulletin, Jul. 2010, 56 pages, retrieved from <http://ww1.microchip.com/downloads/en/AppNotes/01338D.pdf> on Jul. 22, 2016.

Roos, Carolyn, et al., "Solar Electric System Design, Operation and Installation, An Overview for Builders in the Pacific Northwest", Oct. 2009, Washington State University Extension Energy Program.

U.S. Appl. No. 61/270,809, "Method and System for Locating Stolen Solar Power System Components", Unpublished (filed Jul. 14, 2009), (Martin Fronage, Inventor and Assignee).

* cited by examiner

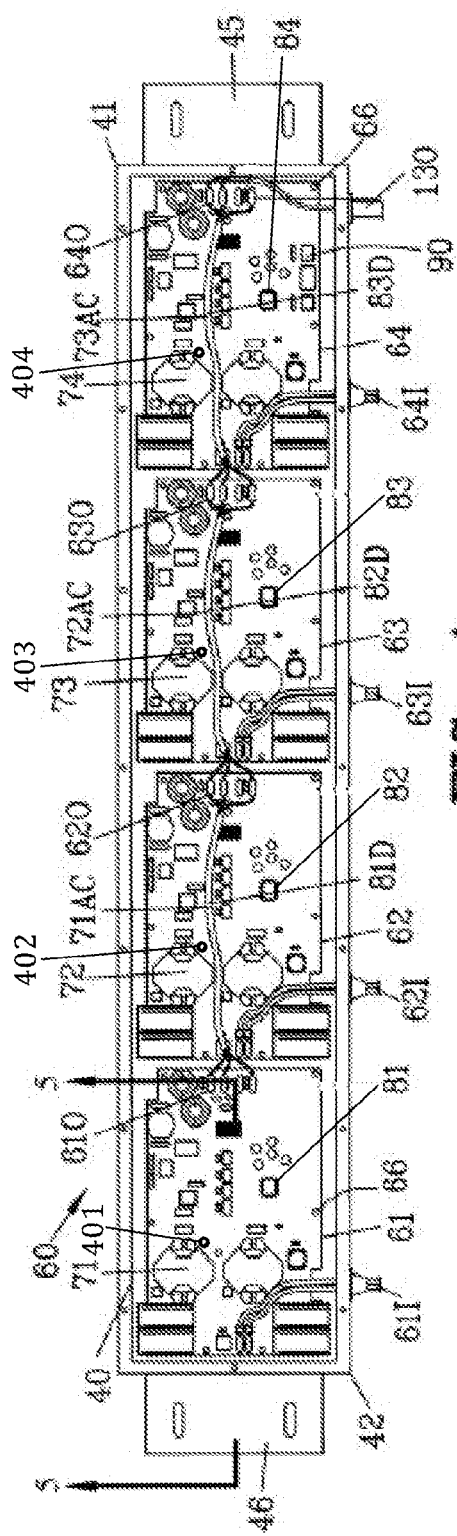
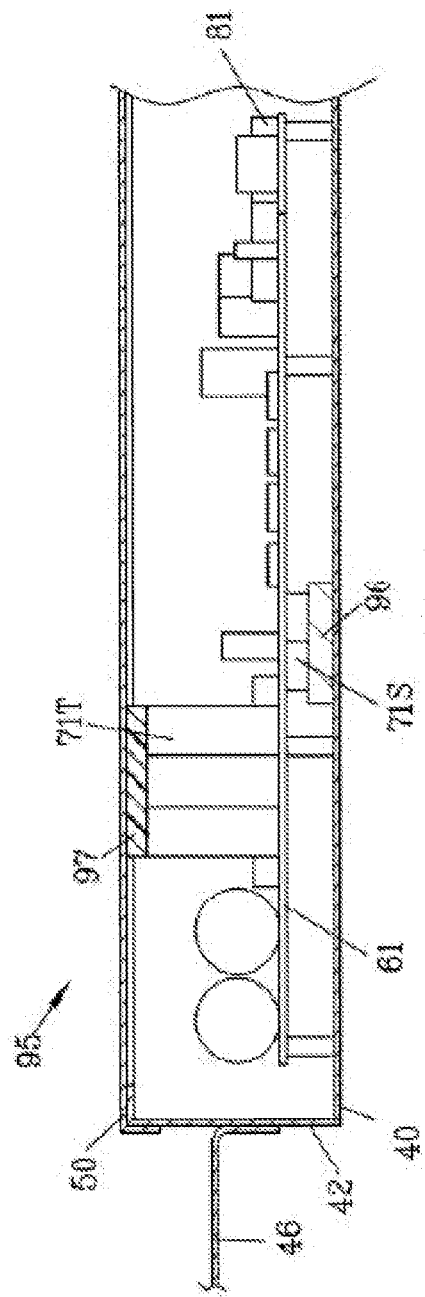
FIG. 4
FIG. 5

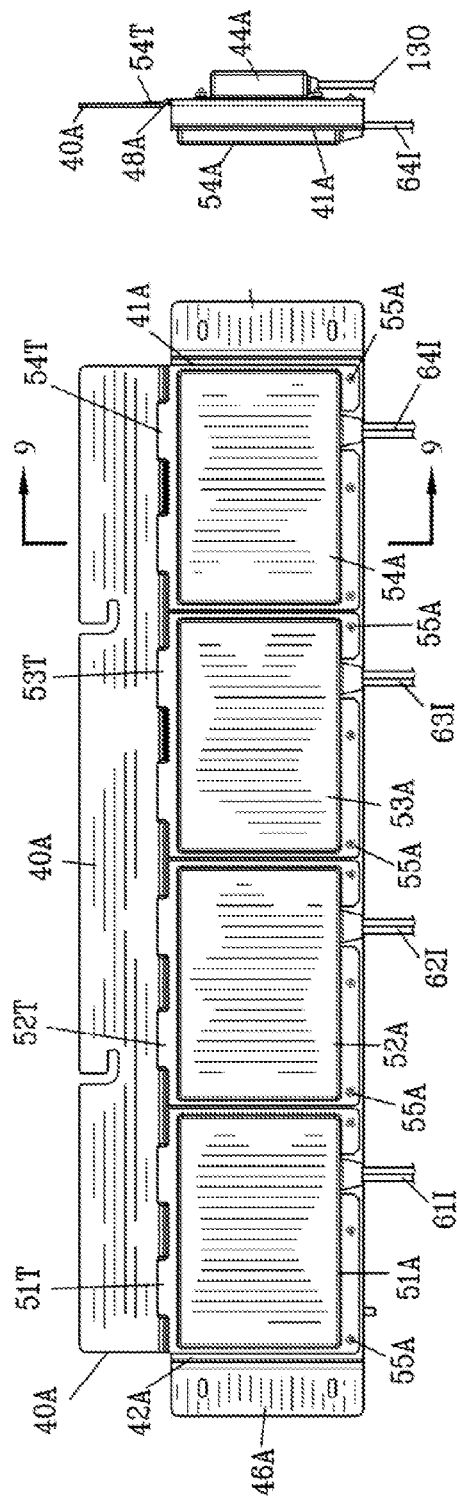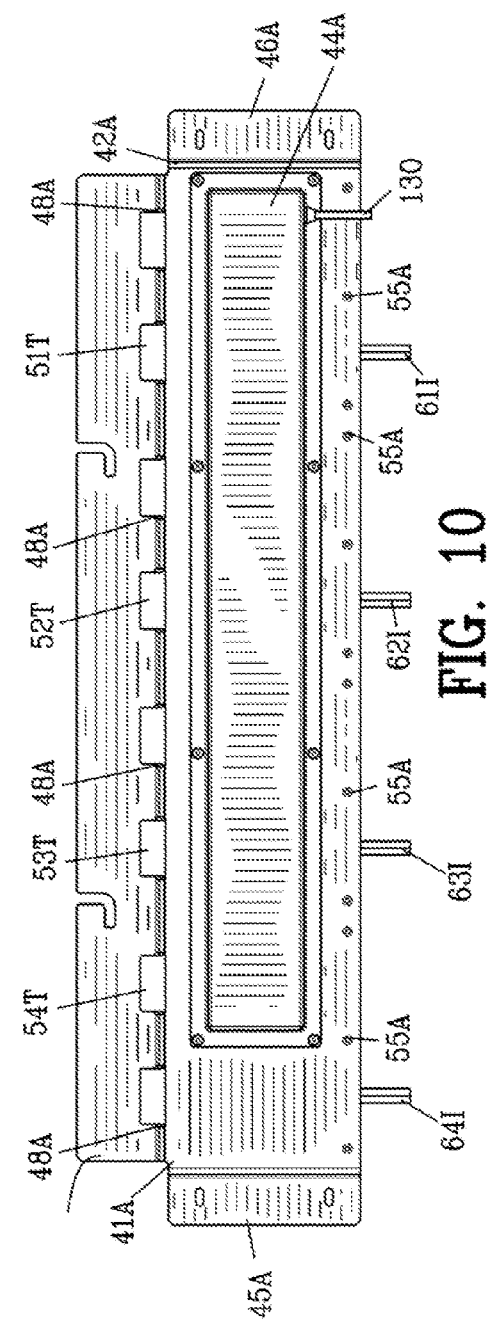
FIG. 8
FIG. 9
FIG. 10

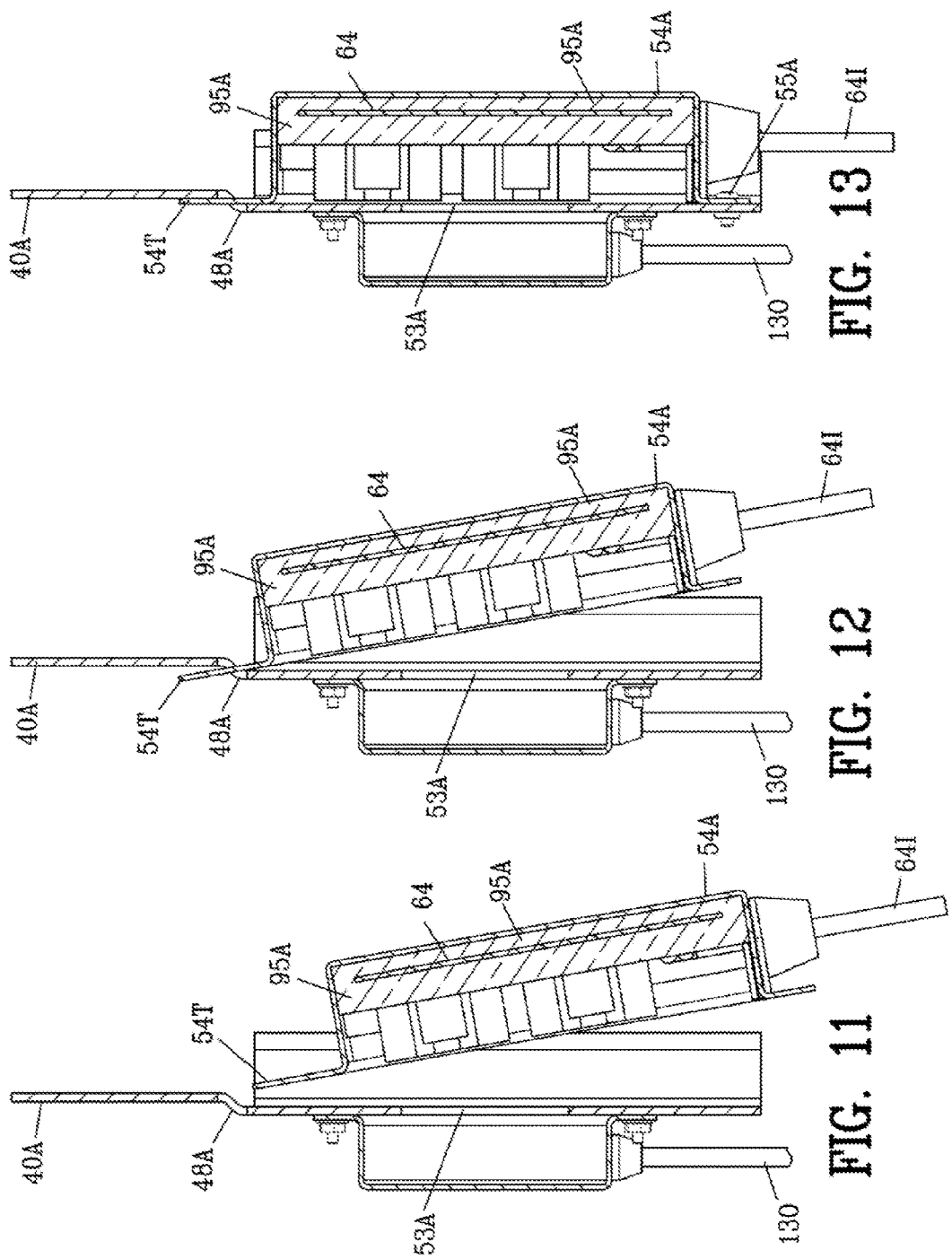

Self Mapping Scheme

| | A | B | C | D | E | F | G | H | I | J | K | L | M | N | O | P |
|---|---|---|---|---|---|---|---|---|---|---|---|---|---|---|---|---|
| | Breaker Status | | | Time | Solar Panel Array 1 | | | | Solar Panel Array 2 | | | | Solar Panel Array 3 | | | |
| 1 | | | | | Inverter 1 | Inverter 2 | Inverter 3 | Inverter 4 | Inverter 1 | Inverter 2 | Inverter 3 | Inverter 4 | Inverter 1 | Inverter 2 | Inverter 3 | Inverter 4 |
| 2 | B1 | B2 | B3 | | P111 | P121 | P131 | P141 | P211 | P221 | P231 | P241 | P311 | P321 | P331 | P341 |
| 3 | | | | | 1084 | 3187 | 6123 | 9854 | 1297 | 3648 | 7128 | 9823 | 2189 | 4181 | 7905 | 8552 |
| 4 | | | | | | | | | | | | | | | | |
| 5 | | | | | | | | | | | | | | | | |
| 6 | C | O | O | 1084 | R1 | | | | | | | | | | | |
| 7 | C | O | O | 3187 | R2 | R1 | | | | | | | | | | |
| 8 | C | O | O | 6123 | R2 | R2 | R1 | | | | | | | | | |
| 9 | C | O | O | 9854 | R2 | R2 | R2 | R2 | | | | | | | | |
| 10 | | | | | | | | | | | | | | | | |
| 11 | O | C | O | 1297 | | | | | R1 | | | | | | | |
| 12 | O | C | O | 3648 | | | | | R2 | R1 | | | | | | |
| 13 | O | C | O | 7128 | | | | | R2 | R2 | R1 | | | | | |
| 14 | O | C | O | 9823 | | | | | R2 | R2 | R2 | R2 | | | | |
| 15 | | | | | | | | | | | | | | | | |
| 16 | O | O | C | 2189 | | | | | | | | | R1 | | | |
| 17 | O | O | C | 4181 | | | | | | | | | R2 | R1 | | |
| 18 | O | O | C | 7905 | | | | | | | | | R2 | R2 | R1 | |
| 19 | O | O | C | 8552 | | | | | | | | | R2 | R2 | R2 | R2 |

Registered    Non Powered, Unregistered    Registered    Non Powered, Unregistered P=Polling B1=Breaker 1 B2=Breaker 2 B3=Breaker 3 P=Panel O=Open C=Closed D=Delayed R1=Registering R2=Registered Inverter=Micro-inverter

FIG. 33

Failure of Solar Panel or Micro-Inverter

| | A | B | C | D | E | F | G | H | I | J | K | L | M | N | O | P | Q |
|---|---|---|---|---|---|---|---|---|---|---|---|---|---|---|---|---|---|
| 1 | Breaker | Inverter 1 (1084) | | | | Inverter 2 (3187) | | | | Inverter 3 (6123) | | | | Inverter 4 (9854) | | | |
| 2 | B1 | P111 | P112 | P113 | P114 | P121 | P122 | P123 | P124 | P131 | P132 | P133 | P134 | P141 | P142 | P143 | P144 |
| 3 | B1 | ☼ | ☼ | ☼ | ☼ | ☼ | ☼ | ☼ | ☼ | ☼ | X | ☼ | ☼ | ☼ | ☼ | ☼ | ☼ |
| 4 | Breaker | Inverter 1 (1297) | | | | Inverter 2 (3648) | | | | Inverter 3 (7128) | | | | Inverter 4 (9823) | | | |
| 5 | B2 | P211 | P212 | P213 | P214 | P221 | P222 | P223 | P224 | P231 | P232 | P233 | P234 | P241 | P242 | P243 | P244 |
| 6 | B2 | ☼ | ☼ | ☼ | ☼ | ☼ | ☼ | ☼ | ☼ | ☼ | ☼ | ☼ | ☼ | ☼ | ☼ | ☼ | ☼ |
| 7 | Breaker | Inverter 1 (2189) | | | | Inverter 2 (4181) | | | | Inverter 3 (7905) | | | | Inverter 4 (8552) | | | |
| 8 | B3 | P311 | P312 | P313 | P314 | P321 | P322 | P323 | P324 | P331 | P332 | P333 | P334 | P341 | P342 | P343 | P344 |
| 9 | B3 | ☼ | ☼ | ☼ | ☼ | ☼ | ☼ | ☼ | ☼ | ☼ | ☼ | ☼ | ☼ | ☼ | ☼ | ☼ | ☼ |

Above Solar Panel P132 on inverter 3 (6123) on B1 has failed

L=Panel Location

B1=Breaker 1
B2=Breaker 2
B3=Breaker 3

FIG. 34

FIG. 35 — Failure of Solar Panel or Micro-Inverter

| | A | B | C | D | E | F | G | H | I | J | K | L | M | N | O | P | Q |
|---|---|---|---|---|---|---|---|---|---|---|---|---|---|---|---|---|---|
| 1 | Breaker | Inverter 1 (1084) | | | | Inverter 2 (3187) | | | | Inverter 3 (6123) | | | | Inverter 4 (9854) | | | |
| 2 | | P111 | P112 | P113 | P114 | P121 | P122 | P123 | P124 | P131 | P132 | P133 | P134 | P141 | P142 | P143 | P144 |
| 3 | B1 | ☼ | ☼ | ☼ | ☼ | ☼ | ☼ | ☼ | ☼ | ☼ | ☼ | ☼ | ☼ | ☼ | ☼ | ☼ | ☼ |
| 4 | Breaker | Inverter 1 (1297) | | | | Inverter 2 (3648) | | | | Inverter 3 (7128) | | | | Inverter 4 (9823) | | | |
| 5 | | P211 | P212 | P213 | P214 | P221 | P222 | P223 | P224 | P231 | P232 | P233 | P234 | P241 | P242 | P243 | P244 |
| 6 | B2 | ☼ | ☼ | ☼ | ☼ | ☼ | X | ☼ | ☼ | ☼ | ☼ | ☼ | ☼ | ☼ | ☼ | ☼ | ☼ |
| 7 | Breaker | Inverter 1 (2189) | | | | Inverter 2 (4181) | | | | Inverter 3 (7905) | | | | Inverter 4 (8552) | | | |
| 8 | | P311 | P312 | P313 | P314 | P321 | P322 | P323 | P324 | P331 | P332 | P333 | P334 | P341 | P342 | P343 | P344 |
| 9 | B3 | ☼ | ☼ | ☼ | ☼ | ☼ | ☼ | ☼ | ☼ | ☼ | ☼ | ☼ | ☼ | ☼ | ☼ | ☼ | ☼ |

Above Solar Panel P222 on inverter 2 (3648) on B2 has failed

L=Panel Location

B1=Breaker 1
B2=Breaker 2
B3=Breaker 3

Failure of Solar Panel or Micro-Inverter

| | A | B | C | D | E | F | G | H | I | J | K | L | M | N | O | P | Q |
|---|---|---|---|---|---|---|---|---|---|---|---|---|---|---|---|---|---|
| 1 | Breaker | Inverter 1 (1084) | | P112 | P113 | P114 | Inverter 2 (3187) | | P122 | P123 | P124 | Inverter 3 (6123) | | P132 | P133 | P134 | Inverter 4 (9854) | | P142 | P143 | P144 |
| 2 | | P111 | ☼ | ☼ | ☼ | ☼ | P121 | ☼ | ☼ | ☼ | ☼ | P131 | ☼ | ☼ | ☼ | ☼ | P141 | ☼ | ☼ | ☼ | ☼ |
| 3 | B1 | | | | | | | | | | | | | | | | | | | | | |
| 4 | Breaker | Inverter 1 (1297) | | | | | Inverter 2 (3648) | | | | | Inverter 3 (7128) | | | | | Inverter 4 (9823) | | | | |
| 5 | | P211 | P212 | P213 | P214 | ☼ | P221 | P222 | P223 | P224 | ☼ | P231 | P232 | P233 | P234 | ☼ | P241 | P242 | P243 | P244 | ☼ |
| 6 | B2 | ☼ | ☼ | ☼ | ☼ | | ☼ | ☼ | ☼ | ☼ | | ☼ | ☼ | ☼ | ☼ | | ☼ | ☼ | ☼ | ☼ | |
| 7 | Breaker | Inverter 1 (2189) | | | | | Inverter 2 (4181) | | | | | Inverter 3 (7905) | | | | | Inverter 4 (8552) | | | | |
| 8 | | P311 | P312 | P313 | P314 | | P321 | P322 | P323 | P324 | ☼ | P331 | P332 | P333 | P334 | ☼ | P341 | P342 | P343 | P344 | ☼ |
| 9 | B3 | X | X | X | X | | ☼ | ☼ | ☼ | ☼ | | ☼ | ☼ | ☼ | ☼ | | ☼ | ☼ | ☼ | ☼ | |

Above inverter 1 (2189) on B3 has failed

L=Panel Location

B1=Breaker 1
B2=Breaker 2
B3=Breaker 3

FIG. 36

INTERFACE FOR RENEWABLE ENERGY SYSTEM

BACKGROUND OF THE INVENTION

Field of the Invention

This invention relates to solar energy and more particularly to an improved interface for renewable energy systems such as photovoltaic solar panels and the like.

Description of the Related Art

The utilization of solar energy extends back to the 7th century B.C., where a magnifying glass was used to make fire. Since then, the evolution of solar technology has progressed from strictly solar to thermal conversion systems to the discovery of the photovoltaic effect in the 1800's.

Advancement of the photovoltaic art continued to progress, and in the 1950's the development of the silicon photovoltaic (PV) cell became the first solar cell capable of producing sufficient power to run simple electrical equipment. In 1964 NASA launched the first Nimbus spacecraft, which was powered by a 470 watt photovoltaic array. In 1981 the first solar powered aircraft had solar cells capable of producing 3,000 watts. In 1983 a stand-alone 4 kilowatt powered home was completed. By 1999, the cumulative worldwide installed photovoltaic capacity reached 1,000 megawatts.

The future of PV technology is expected to produce photovoltaic power to be competitive with traditional power generation sources within 10 years. In order to move toward this goal the cost per watt must be minimized. This requires all elements of a solar power system to consider both cost and system energy requirements. Since solar power systems comprise several key components in addition to the PV cell, development of these components also affects the evolution of the entire solar power system.

Solar panels may be roof mounted on racks and ground mounted with fixed racks which are held stationary as the sun moves across the sky. In other installations, solar trackers sense the direction of the sun and move or tilt the panels to maximize the energy produced per panel. When employing solar tracking systems, overall weight and weight distribution become necessary considerations which affect system energy requirements.

In order to produce power useable for most purposes, the direct current (DC) produced by the PV cell must be converted to alternating current (AC) having the frequency of the local utility. This conversion is accomplished by an inverter. A stand-alone inverter is used in totally isolated systems that normally do not interface with the utility grid. More sophisticated inverters convert the DC to AC at the utility frequency and ensure maintaining the AC inverter output in phase with the utility grid AC phase. Additionally, these inverters must be provided with an anti-islanding feature which will ensure that the inverter switches off upon the loss of grid AC power.

An inverter dedicated to a single solar cell panel is called a micro-inverter. Typically, micro-inverters are mounted to the back of solar cell panel. The weight and placement of the micro-inverter must be considered in the overall system design. Solar panels with enabled solar tracking require power to move or tilt the panel. Therefore overall weight as well as weight distribution about the center of gravity of the system must be considered in order to minimize the energy required to operate the system. Additionally, the heat generated by the micro-inverters operation must be considered in the design of a photovoltaic system. Excess heat may cause damage to both the micro-inverter as well as the solar panel itself. Finally, the micro-inverter must be easily adapted to mounting on solar panels having varying widths.

There have been many in the prior art who have attempted to solve these problems with varying degrees of success. The following US patents and publications are examples of attempts in the prior art to provide an efficient micro-inverter system for a photovoltaic array.

U.S. Pat. No. 8,410,950 to Takehara, et al. discloses a photovoltaic (PV) panel monitoring apparatus including a monitoring module for measuring parameter values related to PV panel output, comparing measured values against minimum and maximum values saved in the monitoring module and outputting an alarm signal when a measured value is outside a range defined by the minimum and maximum values. An alarm signal causes a visual indicator to activate and an audible indicator to sound, thereby assisting maintenance personnel in locating a PV panel with an out-of-range parameter value. The monitoring module further includes a PV panel identification memory for saving an identification code for each PV panel in a PV array. The identification code is transmitted with time, date, and parameter data when the monitoring module detects an out-of-range parameter value. Data may optionally be transmitted from the monitoring module through a communications input/output port or through a wireless transmitter to an external monitoring and control system.

U.S. Pat. No. 8,106,537 to Casey et al discloses a photovoltaic (PV) power generating system and a control system for PV array string-level control and PV modules serially-connected into strings of PV modules. The system includes plural parallel strings of serially-connected power-generating photovoltaic modules that form a PV array, DC/DC micro-converters that are coupled to a DC voltage buss and to the output of a corresponding photovoltaic module or to the output of a string of photovoltaic modules, a gating or central inverter, and a control system. The control system is structured and arranged to control and manage each string of photovoltaic modules, to ensure that power delivered by the photovoltaic power generating system is not affected by photovoltaic modules or strings of photovoltaic modules that are not operating at maximum power transfer efficiency.

US Patent publication 20120313443 to Cheng discloses a method and apparatus for intelligently inverting DC power from DC sources such as photovoltaic (PV) solar modules to single-phase or three-phase AC power to supply power for off-grid applications. A number of regular or redundant off-grid Mini-Inverters with one, two, three, or multiple input channels in a mixed variety can easily connect to one, two, three, or multiple DC power sources such as solar PV modules, invert the DC power to AC power, and daisy chain together to generate and supply AC power to electrical devices that are not connected to the power grid including motors, pumps, fans, lights, appliances, and homes.

US Patent publication 20130012061 to Rotzoll et al. discloses a replaceable photovoltaic inverter mounted on each of a plurality of photovoltaic module for the conversion of direct current, produced by the photovoltaic cells, to alternating current. The inverter is coupled to a mounting bracket on the photovoltaic module such that it can be easily replaced. Replacement of an individual photovoltaic module inverter can occur during continuous operation of the photovoltaic module system with minimal impact on overall power production. The inverter is also mounted apart from the photovoltaic module to facilitate heat transfer generated by operation of the inverter.

US Patent publication 20130002031 to Mulkey et al. discloses an enclosure design to accommodate and support the unique features and capabilities of the smart and scalable power inverters or mini-inverters that have multiple input channels to easily connect to multiple solar PV panels, invert the DC power to AC power, and daisy chain together to generate AC power to feed the power grid or supply power to electrical devices. Further disclosed is a message system using LEDs (light-emitting diodes) mounted on the enclosure to indicate the system status and the status of each input channel of the Smart and Scalable Mini-Inverters.

Unfortunately, none of the preceding prior art has completely satisfied the requirements for a complete solution to the aforestated problem.

Therefore, it is an object of the present invention to provide an improved interface for renewable energy system that is a significant advancement in the solar generating electrical art.

Another object of this invention is to provide an improved interface for renewable energy system incorporating a micro-inverter having an improved heat dissipating system.

Another object of this invention is to provide an improved interface for renewable energy system incorporating an improved mounting system for a photovoltaic solar array.

Another object of this invention is to provide an improved interface for renewable energy system incorporating an improved remote monitoring system.

Another object of this invention is to provide an improved interface for renewable energy system capable of a grid tied operation, off grid operation and emergency power operation.

Another object of this invention is to provide an improved interface for renewable energy system incorporating an automatic transfer switch for automatically switching between a grid tied operation, an off grid operation and an emergency power operation.

Another object of this invention is to provide an improved interface for renewable energy system incorporating a multi-channel micro-inverter with each of the micro-inverters operating independently of the remaining micro-inverters.

Another object of this invention is to provide an improved interface for renewable energy system incorporating a multi-channel micro-inverter incorporating a controller for monitoring and instructing each of the micro-inverters and a redundant power supply for the controller.

Another object of this invention is to provide an improved interface for renewable energy system incorporating that is readily mountable on a variety of renewable energy sources such as photovoltaic solar array, windmills, fuel cells and the like.

Another object of this invention is to provide an improved renewable energy system that is easy to cost effectively produce.

Another object of this invention is to provide an improved renewable energy system that is easy to install and maintain.

Another object of this invention is to provide an improved renewable energy system incorporating an apparatus for identifying a performance and/or fault in a solar panel of a solar panel array.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings

SUMMARY OF THE INVENTION

The present invention is defined by the appended claims with specific embodiments being shown in the attached drawings. For the purpose of summarizing the invention, the invention relates to an improved multi-channel micro-inverter for a plurality of photovoltaic solar panels comprising a container extending between a first and a second end. An AC power bus is disposed in the container having a plurality of input AC power bus connectors and a plurality of input data bus connectors. An AC bus output is connected to the AC bus for connecting AC power and electronic data external the container. A plurality of micro-inverter circuits each have a micro-inverter DC power input and an AC power output connector and a micro-inverter data connector. A DC power connector connects each of the plurality of micro-inverter circuits to the plurality of photovoltaic solar panels, respectively. The plurality of micro-inverter circuits are insertable within the container with the micro-inverter AC power output connector engaging with one of the input AC power bus connectors and with the micro-inverter data connector engaging with one of the plurality of input data bus connectors.

In another embodiment of the invention, the invention is incorporated into an improved mounting for a micro-inverter for a photovoltaic solar panel having a peripheral frame comprising a micro-inverter circuit board comprising a micro-inverter circuit having a power stage. A container extends between a first and a second end for receiving the micro-inverter circuit board therein. A closure seals with the container. A mounting secures the micro-inverter circuit board within the container with the power stage thermally coupled to one of the container and the closure. A plurality of mounting arms mount the closure to the peripheral frame of the solar panel for transferring heat from the micro-inverter circuit board to the peripheral frame of the solar panel.

In another embodiment of the invention, the invention is incorporated into an improved mounting for a micro-inverter for a photovoltaic solar panel having a peripheral frame comprising a micro-inverter circuit board comprising a micro-inverter circuit having a power stage. A container extends between a first and a second end for receiving the micro-inverter circuit board therein. A closure seals with the container. A mounting secures the micro-inverter circuit board within the container with the power stage thermally coupled to one of the container and the closure. A plurality of mounting arms mount the closure to the peripheral frame of the solar panel for transferring heat from the micro-inverter circuit board to the peripheral frame of the solar panel. A thermal transfer medium is interposed between the power stage and one of the container and the closure for thermally coupling the power stage to the one of the container and the closure.

In another embodiment of the invention, the invention is incorporated into an improved mounting for a micro-inverter for a photovoltaic solar panel having a peripheral frame comprising a micro-inverter circuit board comprising a micro-inverter circuit having a power stage. A container extends between a first and a second end for receiving the micro-inverter circuit board therein. A closure seals with the container. A mounting secures the micro-inverter circuit board within the container with the power stage thermally coupled to one of the container and the closure. A plurality of pivots mount the plurality of mounting arms to the closure to different sizes of the peripheral frame of the solar panel.

In another embodiment of the invention, the invention is incorporated into an interface for renewable energy system for interconnecting a plurality of DC power sources between an external AC power grid and an external AC load. The interface for renewable energy system comprises a plurality of micro-inverter circuits each having a micro-inverter DC power input and an AC power output. A DC power connector connects each of the plurality of micro-inverter circuits to the plurality of DC power sources, respectively, for converting DC power from the plurality of DC power sources into AC power. Each of the plurality of micro-inverter circuits has a controller for controlling the AC power from the plurality of micro-inverter circuits to be in phase with the external AC power grid. A grid automatic transfer switch connects the plurality of micro-inverter circuits to the external AC power grid for directing AC power from the plurality of micro-inverter circuits to the external electrical AC power grid. The grid automatic transfer switch disconnects the plurality of micro-inverter circuits from the external AC power grid load upon the loss of power from the external AC power grid. A synchronizing generator is actuated upon the loss of power from the external AC power grid for generating a waveform for phasing the AC power from the plurality of micro-inverter circuits. The grid automatic transfer switch reconnects the plurality of micro-inverter circuits to the AC power grid upon the reestablishment of AC power from the external AC power grid. The synchronizing generator is deactivated upon the reestablishment of AC power from the external AC power grid.

In another embodiment of the invention, the invention is incorporated into an improved micro-inverter for a photovoltaic solar panel producing a DC power comprising a micro-inverter circuit having a micro-inverter DC power input connected for receiving the DC power from the photovoltaic solar panel. A first DC to DC converter is connected to the micro-inverter DC power input for converting the DC power from the photovoltaic solar panel into a first elevated pulsating DC voltage. A second DC to DC converter is connected to the micro-inverter DC power input for converting the DC power from the photovoltaic solar panel into a second elevated pulsating DC voltage. A DC to AC converter is connected to the first and second DC to DC converters for providing an elevated AC power from the first and second elevated pulsating DC voltages. A regulator controls the first and second DC to DC converters for maximizing the elevated AC power from the first and second elevated pulsating DC voltages.

In another embodiment of the invention, the invention is incorporated into an improved micro-inverter arrangement for a plurality of photovoltaic solar panels with each of the plurality of photovoltaic solar panels having a peripheral frame, comprising a plurality of micro-inverter circuits each connected to a respective one of the plurality of photovoltaic solar panels. Each of the plurality of micro-inverter circuits has a power supply powered by respective one of the plurality of photovoltaic solar panels. A controller monitors the plurality of micro-inverter circuits and for transmitting monitored information to a remote location. An interconnecting cable connects each of the power supply to the controller for providing power to the controller in the event of reduced power or failure of one of the plurality of photovoltaic solar panels.

In another embodiment of the invention, the invention is incorporated into a monitoring system for monitoring a plurality of photovoltaic solar panels, comprising a container having an AC power bus disposed in the container defining a plurality of input electrical power bus connectors. An AC output power connector is connected to the AC power bus to connect AC power external the container. A plurality of micro-inverters circuits are connected to a respective one of the plurality of photovoltaic solar panels. A controller is disposed in the container. A data link interconnects the controller for communication with the plurality of micro-inverters circuits. A first digital-analog converter connects the controller to the AC power bus for modulating the AC power on the AC power bus with the monitored data from the plurality of micro-inverters circuits. An electrical monitoring and connectivity device has a second digital-analog converter located external the container and connected to the AC output power connector to display the monitored data from the plurality of micro-inverters circuits. An input device is connected to the electrical monitoring and connectivity device for changing the operation of each of the plurality of micro-inverters circuits through the AC output power connector.

In another embodiment of the invention, the invention is incorporated into an apparatus for mapping and identifying a performance and/or fault in a solar panel of a solar panel array comprising a solar array having a multiplicity of solar panel groups with each solar panel groups having a plurality of solar panels mounted in a specific physical pattern. A micro-inverter is secured to a single and identifiable solar panel of each of the solar panel groups. Each of the micro-inverters has a unique identification numeral and a plurality of numbered inverter ports. A plurality of cables connect the solar panels to specific numbered inverter ports of the micro-inverter for correlating the numbered inverter ports to specific physical locations of the plurality of solar panels within each of the solar panel groups. A trunk line connects the micro-inverters to a circuit breaker. A polling circuit is connected to the circuit breaker for generating a polling signal upon closing the circuit breaker for enabling each of the micro-inverters to transmit the identification numeral and the numbered inverter ports. A status and data circuit is connected to the polling circuit for storing values of the identification numeral and the numbered inverter ports. The status and data circuit monitors the solar array upon closing the circuit breaker for generating a status output containing an identification numeral and a numbered inverter port of a performance and/or fault detected in a solar panel. Thus enabling an operator to determining the physical location of a performance and/or faulty solar panel from the identification numeral and the numbered inverter ports of the performance and/or faulty solar panel based upon the original specific physical pattern of the plurality of solar panels of the solar panel group.

Various other embodiments of the invention are directed to a micro-inverter apparatus configured for converting DC power from one or more photovoltaic cells to AC power. According to various embodiments, the micro-inverter comprises at least one micro-inverter circuit configured for receiving DC power from the one or more photovoltaic cells and converting the input DC power into output AC power; at least one temperature sensor configured for sensing the operating temperature of the micro-inverter circuit; and at least one microcontroller in communication with the micro-inverter circuit and the temperature sensor, the microcontroller configured receive data indicative of a predefined threshold temperature value and regulate the AC power output of the micro-inverter circuit to prevent the micro-inverter circuit from operating at a temperature exceeding the predefined threshold temperature value.

Further embodiments of the invention are directed to a micro-inverter apparatus configured for converting DC power from one or more photovoltaic cells to AC power in which the micro-inverter comprises at least one micro-inverter circuit configured for receiving DC power from the one or more photovoltaic cells and converting the input DC power into output AC power; and at least one microcontroller in communication with the micro-inverter circuit. In such embodiments, the microcontroller configured may be configured to sense the total harmonic distortion of the micro-inverter circuit's AC power output; receive data indicative of a predefined threshold total harmonic distortion value; and regulate the AC power output of the micro-inverter circuit to prevent the micro-inverter circuit from producing AC power having a total harmonic distortion that exceeds the predefined threshold total harmonic distortion value.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 4 is a view of a container shown in FIGS. 2 and 3 with a protective closure removed exposing the multi-channel micro-inverter of the present invention;

FIG. 5 is an enlarged sectional view along line 5-5 in FIG. 4;

FIG. 8 is an elevation view of the second embodiment of the container of FIG. 6;

FIG. 9 is a sectional view along line 9-9 in FIG. 8;

FIG. 10 is a rear view of FIG. 8;

FIG. 11 is an enlarged side sectional view of the first step of inserting a micro-inverter circuit unit into the container of FIGS. 6-10;

FIG. 12 is an enlarged side sectional view of the second step of inserting a micro-inverter circuit unit into the container of FIGS. 6-10;

FIG. 13 is an enlarged side sectional view of the final step of inserting a micro-inverter circuit unit into the container of FIGS. 6-10;

FIG. 33 is a table illustrating the polling and the identification of the micro-inverters of the solar arrays;

FIG. 34 is a table illustrating a first performance and/or fault of a solar array;

FIG. 35 is a table illustrating a second performance and/or fault of a solar array;

FIG. 36 is a table illustrating a third performance and/or fault of a micro-inverter.

Similar reference characters refer to similar parts throughout the several Figures of the drawings.

DETAILED DISCUSSION

Figure 1:
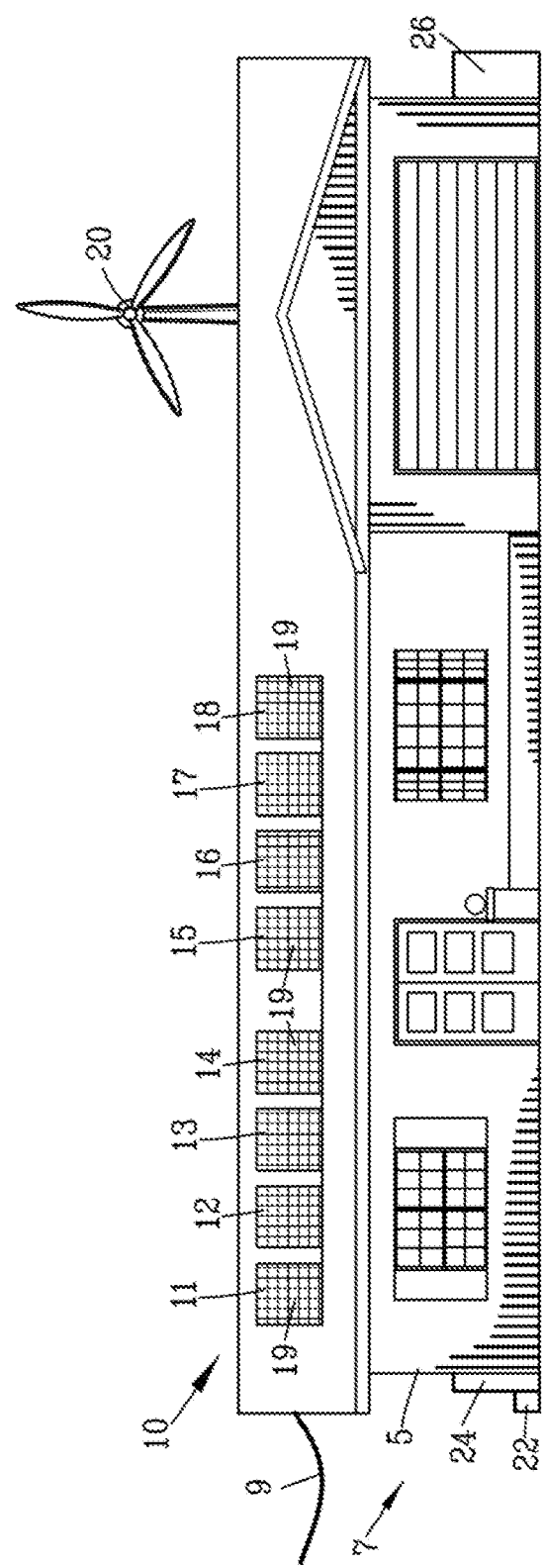
FIG. 1 is a front view of a building structure having multiple renewable energy sources including a photovoltaic solar array having a plurality of photovoltaic solar panels and a wind turbine.

FIG. 1 is a front view of a building structure 5 incorporating an interface for renewable energy system 7 for interconnecting a plurality of power sources to an AC power grid 9. The plurality of power sources include a photovoltaic solar array 10 and a wind turbine 20. Preferably, the photovoltaic solar array 10 and the wind turbine 20 incorporate an energy storage unit such as a battery array 22 and/or a fuel cell array 24. Preferably a fuel operated generator 26 is incorporated into the system for emergency operation.

The photovoltaic solar array 10 is illustrated having a plurality of photovoltaic solar panels 11-18. Although the building structure 5 has been shown as a residential building structure, it should be understood that the photovoltaic solar array 10 may be mounted on virtually any type of building structure as well as being mounted on a ground surface.

Each of the plurality of photovoltaic solar panels 11-18 is made from a multiplicity of photovoltaic solar cells 19. Typically, each of the photovoltaic solar cells 19 generates approximately 0.5 volts. The photovoltaic solar cells 19 are connected in series-parallel to provide approximately 300 watts of power at 30 volts.

In some instances, individual photovoltaic solar panels 11-18 are mounted on equatorial mounts (not shown) for following the movement of the sun throughout the day. The structure and operation of an equatorial mount is notoriously well known to those skilled in the art.

Figure 2:
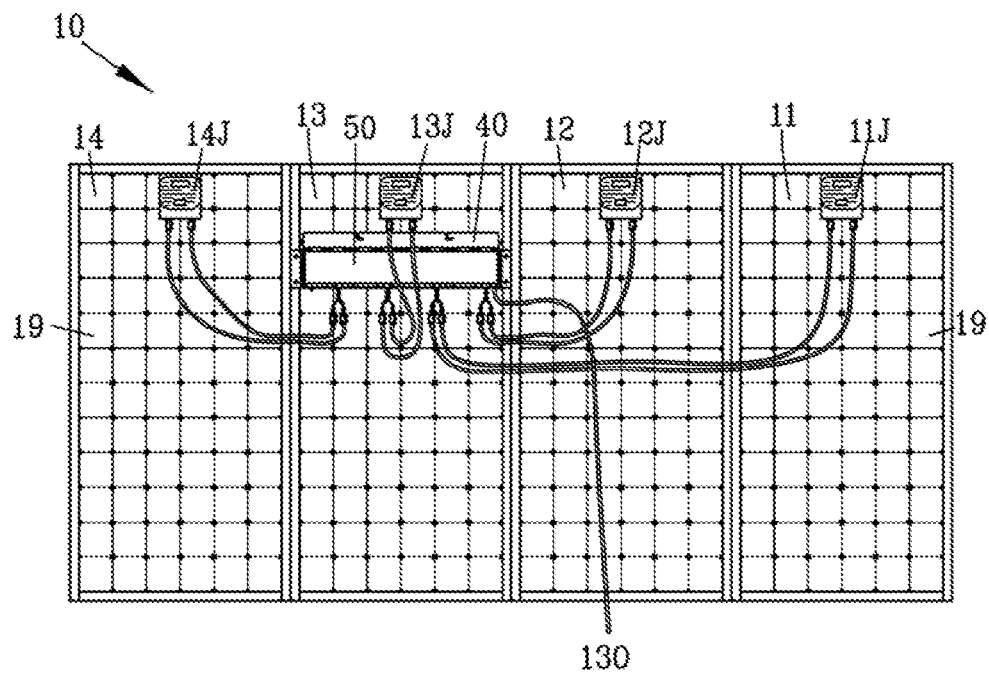
FIG. 2 is a rear view of one of the photovoltaic solar panels of FIG. 1 interconnected to an improved multi-channel micro-inverter of the present invention.
Figure 3:
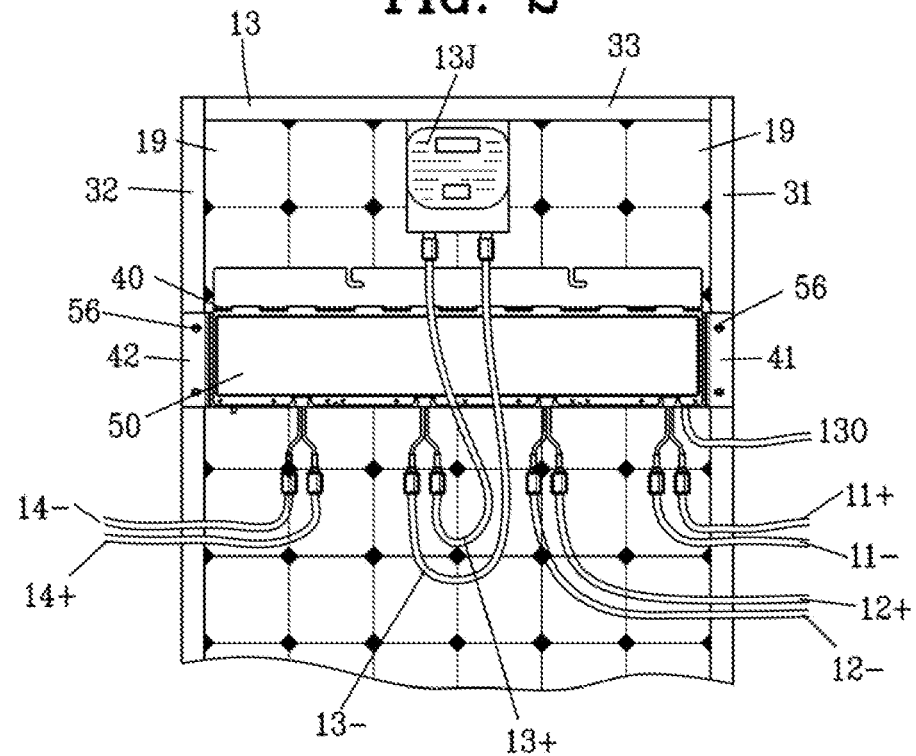
FIG. 3 is an enlarged view of the photovoltaic solar panel of FIG. 2.
Figure 6:
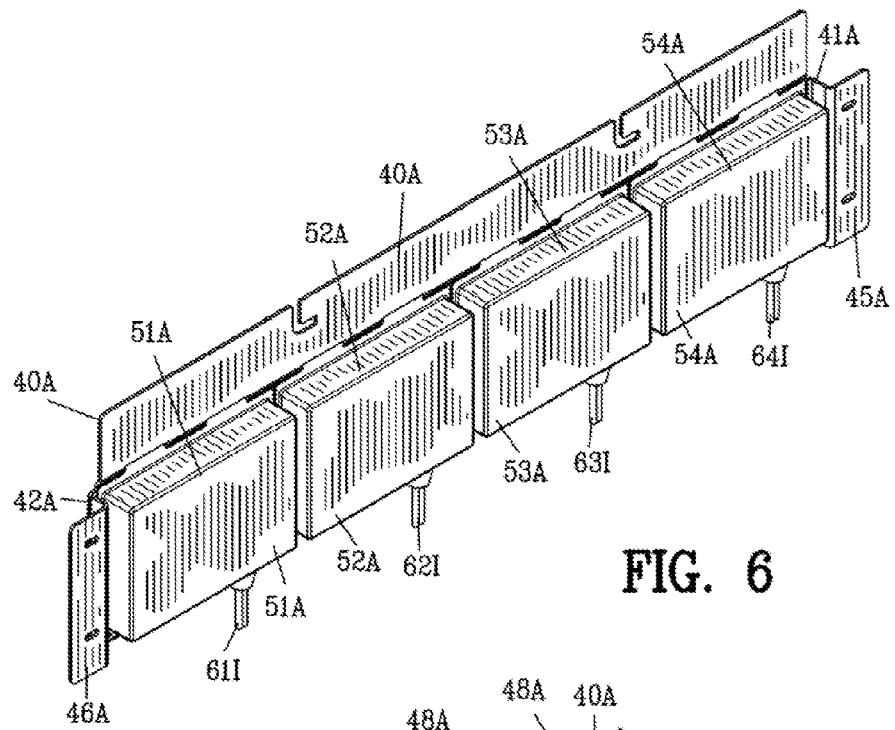
FIG. 6 is an isometric view of a second embodiment of a container for housing the multi-channel micro-inverter of the present invention.
Figure 7:
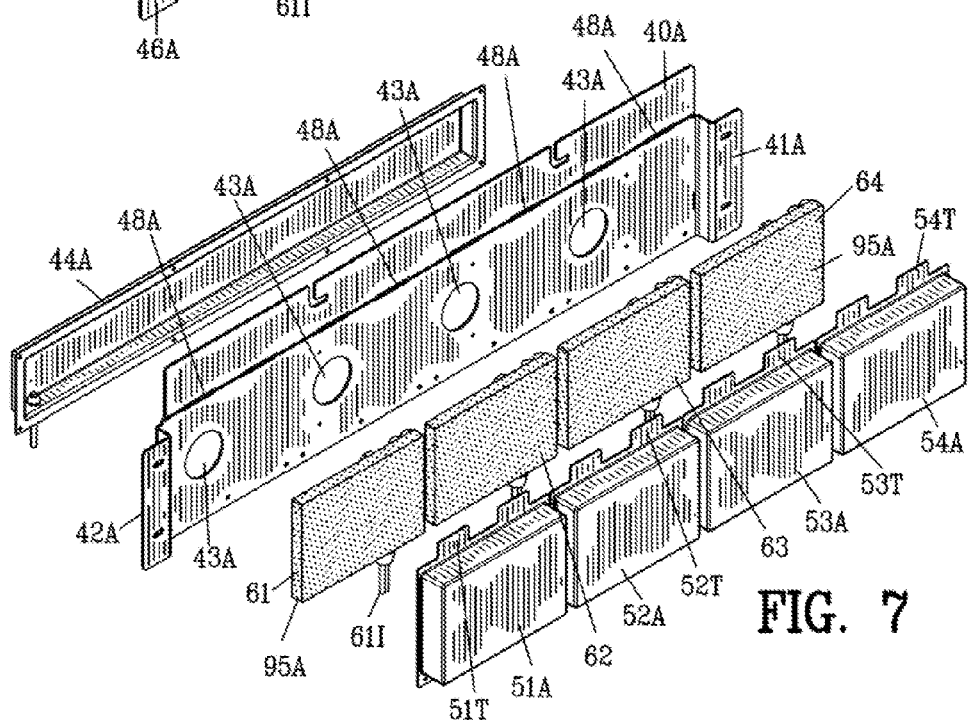
FIG. 7 is an exploded isometric view of FIG. 6.

FIGS. 2-4 are rear view of the photovoltaic solar panels 11-14 of FIG. 1. Each of the photovoltaic solar panels 11-14 includes a junction box 11J-14J for connecting the multiplicity of solar cells 19 to positive conductor 11+ to 14+ and negative conductor 11− to 14−. The photovoltaic solar panel 13 defines a peripheral frame 30 including opposed peripheral frame rails 31 and 32 and opposed peripheral frame rails 33 and 34.

A container 40 extends between a first and a second end 41 and 42. The container 40 includes mounting arms 43 and 44 shown as flanges 45 and 46 extending from opposed ends 41 and 42 of the container 40. The flanges 45 and 46 of container 40 are secured to the opposed peripheral frame rails 31 and 32 of the photovoltaic solar panel 13. The flanges 45 and 46 make thermal contact with the peripheral frame rails 31 and 32 of the photovoltaic solar panel 13 for transferring heat from the container 40 to the peripheral frame 30 of the solar panel 13.

A closure 50 engages with the container 40 to form a weather tight seal with the container 40 for housing a multi-channel micro-inverter 60 within the container 40. Preferably, the closure 50 is secured to the container by a plurality of threaded fasteners 55 for permitting removal of the closure 50 for servicing or re placing the multi-channel micro-inverter 60 therein.

As best shown in FIG. 4, the multi-channel micro-inverter 60 comprises a plurality of independent micro-inverter boards 61-64. As will be described in greater detail hereinafter, each of the micro-inverter board 61-64 is independently mounted in the container 40 for replacement and repair. The micro-inverter boards 61-64 are secured to the container 40 by a plurality of threaded fasteners 66 enabling a micro-inverter board to be inserted and removed for repair or replacement.

Preferably, four independent micro-inverter boards 61-64 are mounted in the container 40 enabling 30 ampere wire to be used to connect the multi-channel micro-inverter 60 to an external load or to an external electrical grid.

Each of the micro-inverter boards 61-64 has a micro-inverter DC power input 61I-64I and an AC power output 61O-64O. The positive conductor 11+ to 14+ and negative conductor 11− to 14− of the photovoltaic solar panels 11-14 are connected to the power input 61I-64I of the plurality of independent micro-inverter boards 61-64.

A plurality of micro-inverters 71-74 are disposed on the micro-inverter boards 61-64. The micro-inverters 71-74 receive DC power from the power inputs 61I-64I of the plurality of independent micro-inverter boards 61-64 and provide AC Power on the AC power output 61O-64O of the plurality of independent micro-inverter boards 61-64. A plurality of regulators 81-84 are disposed on the micro-inverter boards 61-64 for controlling the micro-inverters 71-74 and for providing communication between the micro-inverter boards 61-64.

An AC power bus interconnects the AC power output 61O-64O of the plurality of independent micro-inverter boards 61-64 in a parallel configuration. The combined AC power output 61O-64O of the plurality of independent micro-inverter boards 61-64 is provided on a multi-channel micro-inverter power output conductor 13O. In this embodiment, the AC power bus is shown as AC cables 71AC-73AC connecting the AC power output 61O-63O of the plurality of independent micro-inverter boards 61-63 to the AC power output 64O of the micro-inverter board 64. An AC cable 74AC connects the AC power output 64O of micro-inverter board 64 to the multi-channel micro-inverter power output conductor 13O.

A data bus interconnects the plurality of regulators 81-84 disposed on the micro-inverter boards 61-64 for providing digital communication between the micro-inverter boards 61-64. In this embodiment, the data bus is shown as jumper cables 81D-83D connecting the plurality of regulators 81-84.

A controller 90 is located on one of the micro-inverter board 64. The controller communicates with the plurality of regulators 81-84 for monitoring and setting the parameters of the operation of the independent micro-inverters 71-74. Preferably, the controller 90 communicates with the plurality of regulators 81-84 through an inter micro-inverter network protocol such as RS-485 data link or an optical link. In addition, the controller communicates with the plurality of regulators 81-84 for monitoring the operation of the photovoltaic solar panels 11-14 and for monitoring the operation of the micro-inverters 71-74. Furthermore, the controller 90 communicates the monitored data through multi-channel micro-inverter power output conductor 13O for transfer to a remote location by power line carrier communications (PLCC). The controller 90 modulates the AC power with the monitored data on the AC power output 64O of micro-inverter board 64. The monitored data on the AC power exits the multi-channel micro-inverter power output conductor 13O for transfer to a remote location. The more detailed explanation of the operation of the plurality of regulators 81-84 and the controller 90 will be set forth hereafter.

FIG. 5 is an enlarged sectional view along line 5-5 in FIG. 4. Each of the micro-inverters 71-74 has a power stage comprising micro-inverter switches 71S-74S and micro-inverter transformers 71T-74T. A non-electrically conductive thermal conductive medium 95 thermally coupled the power stage of the micro-inverter 71-74 to one of the container 40 and the closure 50. The container 40 transfers heat from the power stage of the micro-inverter 71-74 to the peripheral frame 30 of the solar panel 13. Preferably, the thermal conductive medium 95 comprises a first thermal transfer medium 96 interposed between the power stage and the container 40 and a second thermal transfer medium 97 interposed between the power stage and the closure 50 for thermally coupling the power stage to the container 40.

The micro-inverter board 61 defines an under side and an upper side of the micro-inverter board 61. In this embodiment, the micro-inverter switches 71S-74S are mounted on the underside of the micro-inverter boards 61-64 whereas the micro-inverter transformers 71T-74T are mounted on the upper side of the micro-inverter boards 61-64. In the example, the micro-inverter switches 71S-74S are shown as metal oxide semiconductor field effect transistors (MOSFET) with the metal component thereof mounted remote from the micro-inverter circuit board 61. A first resilient thermal transfer medium 96 is interposed between the metal component of the micro-inverter switches 71S-74S and the container 40. A second resilient thermal transfer medium 97 is interposed between the micro-inverter transformers 71T-74T and the closure 50. The first and second thermal transfer mediums 96 and 97 thermally couple the power stage to the peripheral frame 30 of the solar panel 13. The thermal transfer from the micro-inverters to the container 40 coupled with the thermal transfer from the container 40 to the peripheral frame 30 of the solar panel 13 eliminates the need for heat sinks and cooling fans for the multi-channel micro-inverter 60.

It has been found that the use of four micro-inverters 61-64 in a single container 40 is the optimum for heat dissipation and weight when the four micro-inverters 61-64 are void of any heat sinks or cooling fans. The elimination of heat sinks and cooling fans increases the overall efficiency and lowers the cost of the four micro-inverters 61-64 in a single container 40. In addition, the use of four micro-inverters 61-64 in a single container 40 permits 30 ampere wire to be used for the AC power output of the multi-channel micro-inverter 60.

FIGS. 6-10 illustrate a second embodiment of a container 40A for the multi-channel micro-inverter 60 of the present invention. In this embodiment, the container 40A extends between a first and a second end 41A and 42A. The container 40A includes through apertures 43A. A shield 44A is secured to form a seal with the back of the container 40A. Flanges 45A and 46A extend from opposed ends 41A and 42A of the container 40A for securing to the opposed peripheral frame rails 31 and 32 of the photovoltaic solar panel 13 as shown in FIGS. 2-3. The flanges 45A and 46A make thermal contact with the peripheral frame rails 31 and 32 of the photovoltaic solar panel 13 for transferring heat from the container 40A to the peripheral frame 30 of the solar panel 13. The container 40A defines a plurality of slots 48A the function of which will be described in greater detail here and after.

A plurality of closures 51A-54A includes tabs 51T-54T extending from the closures 51A-54A. The tabs 51T-54T of the plurality of closures 51A-54A cooperate with the plurality of slots 48A to secure the plurality of closures 51A-54A to the container 40A.

Each of the micro-inverter boards 61-64 independently engages a thermal conductive medium or may be encapsulated in a non-electrically conductive and thermal transfer potting compound 95A. The micro-inverter boards 61-64 are independently housed in the plurality of closures 51A-54A.

FIG. 11 is an enlarged side sectional view of the first step of inserting the micro-inverter board 64 into the container 40A of FIGS. 6-10. The micro-inverter board 64 is placed within the closure 54A. The AC cables 71AC-73AC shown in FIG. 4 are connected from the AC power output 61O-63O of the plurality of independent micro-inverter boards 61-63 through the apertures 43A to the AC power output 64O of the micro-inverter board 64. Similarly, the jumper cables 81D-83D shown in FIG. 4 extend through the apertures 43A to connect the plurality of regulators 81-84. An AC cable 74AC connects the AC power output 64O of micro-inverter board 64 to the multi-channel micro-inverter power output conductor 13O.

FIG. 12 is an enlarged side sectional view of the second step of inserting a micro-inverter board 64 into the container of FIGS. 6-10. The tab 54T extending from the closure 54A is inserted into the slots 48A.

FIG. 13 is an enlarged side sectional view of the final step of inserting a micro-inverter board 64 into the container of FIGS. 6-10. The closure 54A is rotated about the tab 54T enabling the closure 54A to be secured to the container 40A by a plurality of threaded fasteners 55A. When the closure 54A is fastened to the container 40A by the plurality of threaded fasteners 55A, the closure 54A applies pressure to thermally engage the power stage of the micro-inverter 74 including the micro-inverter switch 74S and the micro-inverter transformer 74T to the container 40A.

Figure 14:
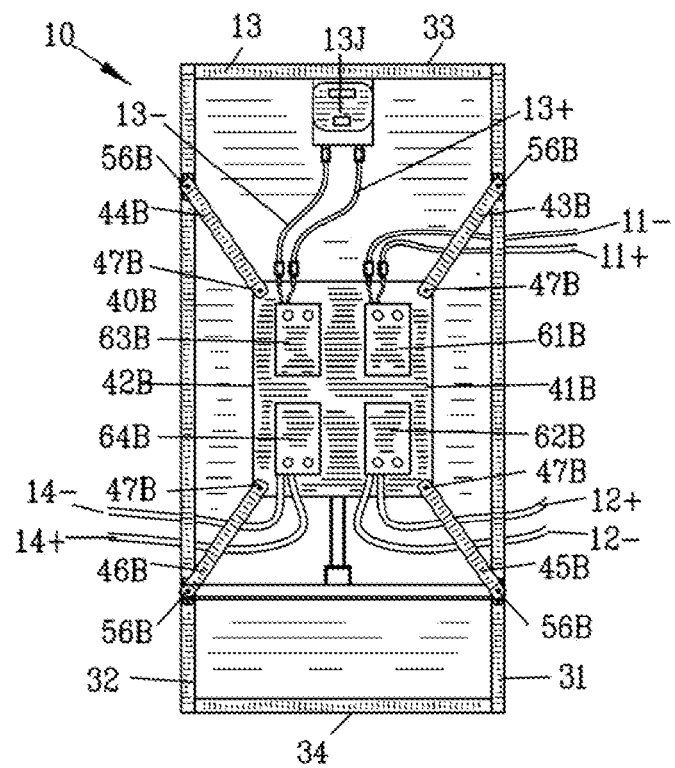
FIG. 14 is a rear view of one of the photovoltaic solar panels of FIG. 1 with a second embodiment of a mounting securing a container of the multi-channel micro-inverter to the photovoltaic solar panels.

FIG. 14 is a rear view of photovoltaic solar panel 13 of FIG. 1 with a second embodiment of a mounting the container 40B of the multi-channel micro-inverter 60 to the photovoltaic solar panel 13. The container 40B extends between a first and a second end 41B and 42B. The container 40B includes mounting arms 43B-46B extending from opposed ends 41B and 42B of the container 40B. The mounting arms 43B-46B secure the container 40B to the opposed peripheral frame rails 31 and 32 of the photovoltaic solar panel 13. The mounting arms 43B-46B make thermal contact with the peripheral frame rails 31 and 32 of the photovoltaic solar panel 13 for transferring heat from the container 40B to the peripheral frame 30 of the solar panel 13.

The micro-inverters 61B-64B are approximately ninety five percent (95%) efficient. Assuming an output of 300 Watt per micro-inverter 61B-64B, the total heat to be dissipated by the enclosure is approximately 60 watts. To reduce cost, the power output stages of the micro-inverters 61B-64B are void of heat sinks and cooling fans. In this embodiment, the power output stages of the micro-inverter 61B-64B are distributed about remote portions of the container 40B for distributing the heat of the power output stages. Mounting the container 40B in the geometric center of the solar panel frame 30 provides better heat distribution for the power outputs and for the photovoltaic solar panel 13.

The container 40B is mounted in the geometric center of the peripheral frame 30 to insure the center of mass of the container 40B coincident with the center of mass of the photovoltaic solar panel 13. The coincidence of the center of mass of the container 40B and the photovoltaic solar panel 13 provides a superior weight distribution in the event the photovoltaic solar panel 13 is mounted on an equatorial mount (not shown).

Figure 15:
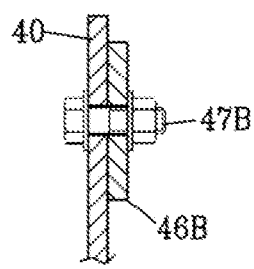
FIG. 15 is an enlarged side sectional view illustrating a mounting of one of a plurality of arms to the container of the multi-channel micro-inverter of FIG. 14.

FIG. 15 is an enlarged sectional view of a portion of FIG. 14 illustrating the connection of the mounting arm 46B to the container 40B enabling the mounting arm 43B to pivot relative to the container 40B.

Figure 16:
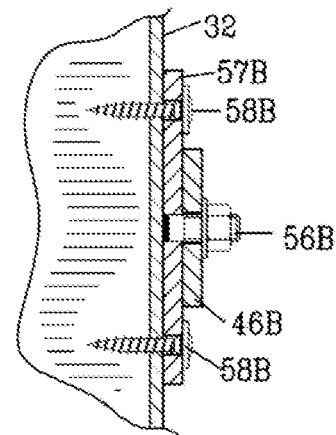
FIG. 16 is an enlarged side sectional view illustrating a mounting of one of a plurality of arms to the peripheral frame of the photovoltaic solar panel.
Figure 17:
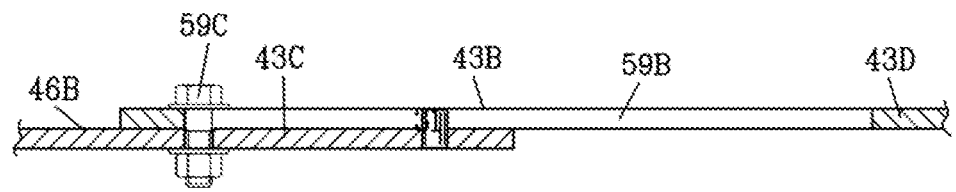
FIG. 17 is an enlarged side sectional view illustrating one of a plurality of arms having a variable length.

FIG. 16 is an enlarged sectional view of a portion of FIG. 14 illustrating the connection of the mounting arm 46B to the peripheral frame rail 32 of the solar panel 13. The mounting arm 46B is connected to a bracket 57B by a threaded fastener 56B. The bracket 57B is connected to the peripheral frame rail 32 of the solar panel 13 by mechanical fasteners shown as self-taping screws 58B FIG. 17 illustrates an alternate connection of the mounting arm 43B to the container 40B. The mounting arm 43B includes a first mounting arm section 43C and a second mounting arm section 43D. A longitudinally extending slot 59B is defined in the second mounting arm section 43D of the mounting arm 43B. A mechanical fastener 59C engages with the slot 59B to adjust the length of mounting arm section 43D relative to the mounting arm section 43C thereby adjusting the length of the mounting arm 43B to the solar panel 13. The mounting system shown in FIGS. 14-17 enables the container 40B to be mounted to different sizes of solar panels 13.

Figure 18:
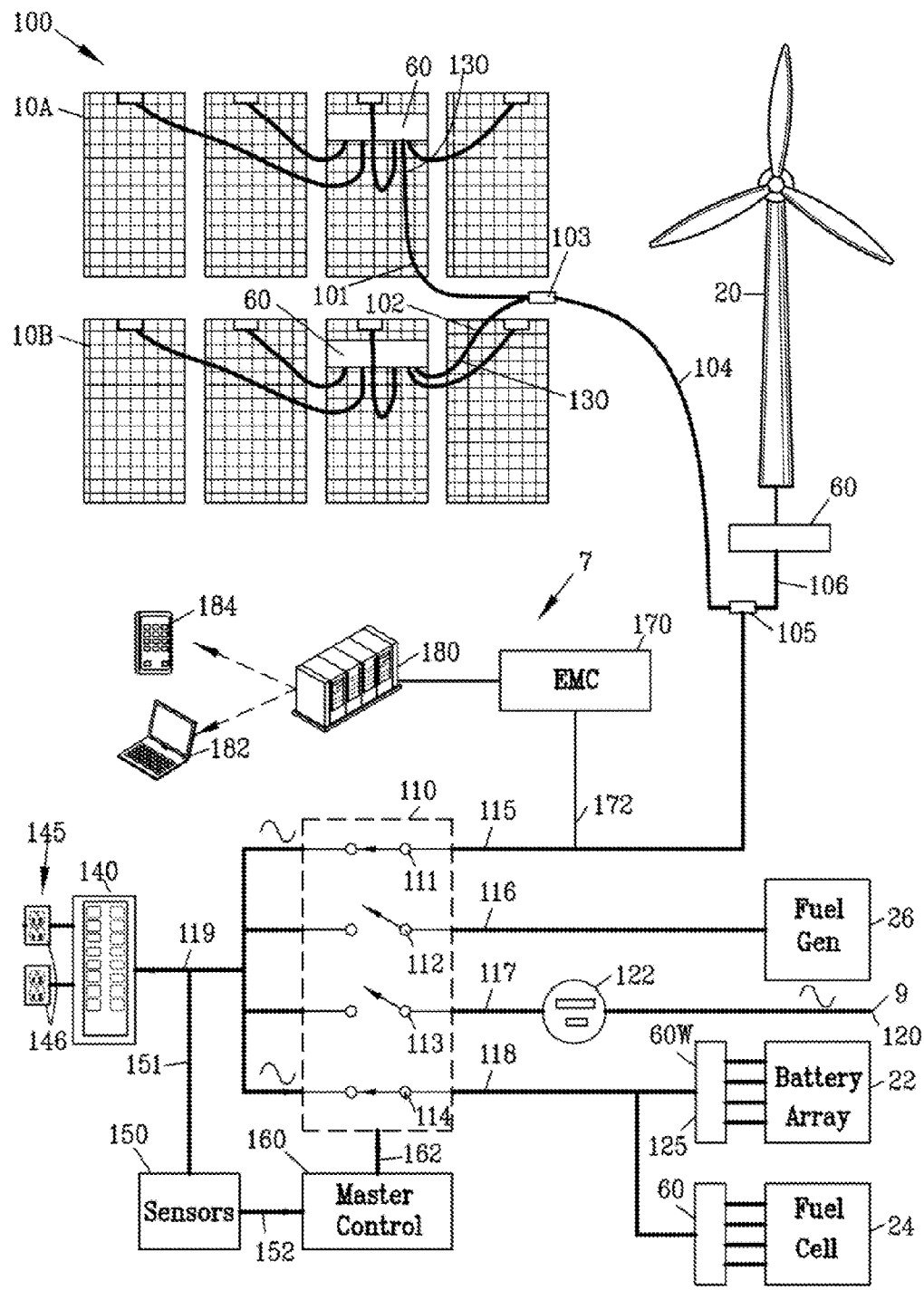
FIG. 18 is a diagram of the interface for a renewable energy system incorporating the improved multimode multi-channel micro-inverter of the present invention interconnecting multiple renewable energy sources to an electrical grid.

FIG. 18 is a diagram of the renewable energy system 7 is capable of operation in three modes namely a grid tied operation mode, an off grid operation mode and an emergency operation mode. The interface for renewable energy system 7 switches automatically between the grid tied operation mode, the off grid operation mode and the emergency operation mode.

The renewable energy system 7 comprises multiple photovoltaic arrays 10A and 10B. Each of the multiple photovoltaic solar arrays 10A and 10B is identical to the photovoltaic solar arrays 10 shown in FIGS. 2-5. Each of the multiple photovoltaic solar arrays 10A and 10B includes a multi-channel micro-inverter 60. The multi-channel micro-inverter 60 of the photovoltaic solar arrays 10A and 10B are connected by electrical cables 101 and 102 to a junction box 103. As previously described, the preferred configuration of four micro-inverters per multi-channel micro-inverter enables 30 ampere cable to be used for electrical cables 101 and 102. The output of junction box 103 is connected by cable 104 to a junction box 105.

The renewable energy system 7 comprises the wind turbine 20 connected to a micro-inverter 60. The micro-inverter 60 of the wind turbine 20 is connected by electrical cable 106 to the junction box 105.

The interface for renewable energy system 7 includes a switching matrix 110 comprising switches 111-114. The switches 111-114 are connected to conductors 115-118. The junction box 105 is connected by conductor 115 to the switch 111 of the switching matrix 110.

The fuel operated generator 26 is connected by the conductor 116 to the switch 112 of the switching matrix 110. The fuel operated generator 26 may be any type of generator operating on a petroleum based fuel such as diesel, gasoline, natural gas, propane and the like. The fuel operated generator 26 operates only in emergency situation and only upon the loss of AC power from the AC power grid 9.

The AC power grid 9 is shown as a conventional external electrical grid 120 of 120 volt at 60 Hz. It should be appreciated that the interface for renewable energy system 7 is suitable for use with 120 to 240 volt 50-60 Hz electrical systems. The external electrical grid 120 is connected through a conventional wattmeter 122 and conductor 117 to the switch 113 of the switching matrix 110. Since the fuel operated generator 26 operates only in emergency situation and only upon the loss of AC power from the AC power grid 9, switch 112 and 113 may be mechanically interconnected to prevent the simultaneous closing of switches 112 and 113.

The battery array 22 is connected to a multi-channel micro-inverter 60W. The output of the multi-channel micro-inverter 60W is connected through conductor 118 to the switch 114 of the switching matrix 110. The multi-channel micro-inverter 60W operates in two modes. In the first mode of operation, the multi-channel micro-inverter 60W to convert DC power from the battery array 22 into AC power as previously described. In the second mode of operation, the multi-channel micro-inverter 60W operates as battery charger for charging battery array 22 upon AC power appearing on conductor 118.

Preferably, the multi-channel micro-inverter 60W includes a waveform generator 125. When actuated, waveform generator 125 produces a 60 Hz sine wave for synchronizing the phase of the AC power produced by the micro-inverters 60 in the absence of AC power from the external electrical grid 120. The operation and function of the waveform generator 125 will be discussed in greater detail hereinafter.

The fuel cell 24 is connected to a multi-channel micro-inverter 60. The multi-channel micro-inverter 60 is connected through conductor 118 to the switch 114 of the switching matrix 110.

An electrical service circuit breaker box 140 is connected by conductor 119 to the switching matrix 110. The electrical service circuit breaker box 140 powers a load 145 represented by conventional electrical outlets 146. The opening and closing of switches 111-114 connect the various power sources connected to the conductors 115-118 to the electrical service circuit breaker box 140 to power the load 145.

Sensors 150 represented by the sensor box are connected to receive input 151 from the interface for renewable energy system 7. The sensors 150 monitor the various parameters of the various power sources connected to the conductors 115-118. An output 152 of the sensors 150 is connected to a master control 160 for opening and closing the switches 111-114 as will be described hereinafter.

An electrical monitor controller 170 is connected to the interface for renewable energy system 7 for remotely monitoring the operation of the interface for renewable energy system 7 and for receiving instruction from a remote location. The electrical monitor controller 170 is connected to the interface for renewable energy system 7 by a data conductor 172. The electrical monitor controller (EMC) 170 communicates with the controllers 90 of the multi-channel micro-inverters 60 and the master control 160 by power line carrier communications (PLCC). In addition, the electrical monitor controller (EMC) 170 provides communication with the internet 180 for remotely monitoring, remotely alerting, or remotely entering instruction from a computer 182 or a mobile device 184 into the controllers 90 of the multi-channel micro-inverters 60 and the master control 160.

Figure 19:
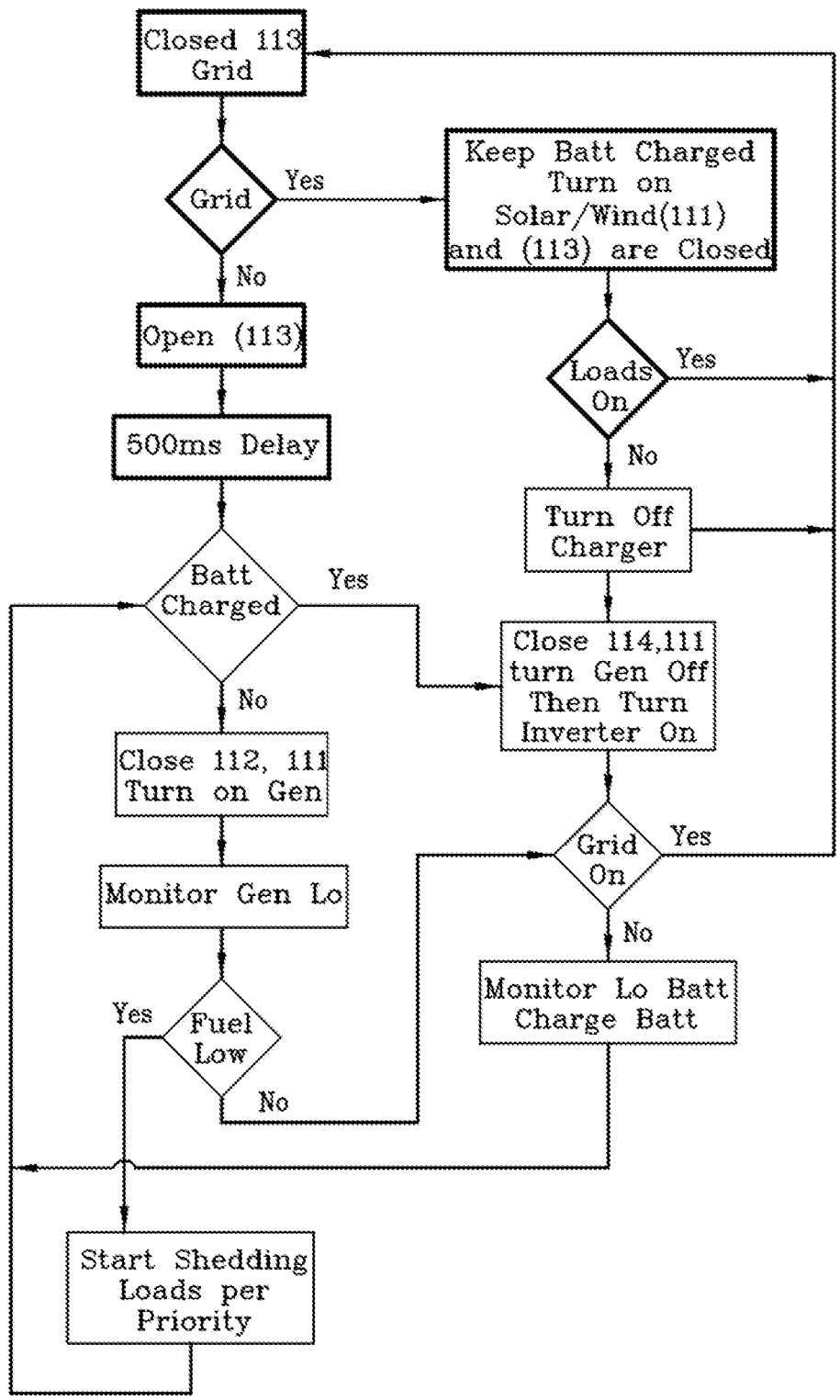
FIG. 19 is a logic diagram of the operation of the interface for renewable energy system of FIG. 18.

FIG. 19 is a logic diagram of the operation of the interface for renewable energy system 7 of FIG. 18. The logic diagram illustrates the program stored in the master control 160 of FIG. 18. The logic diagram illustrates various alternative operations available to the interface for renewable energy system 7 when operating in a grid tied mode of operation.

Furthermore, the logic diagram illustrates various alternative operations available to the interface for renewable energy system 7 upon loss of AC power on the electrical grid 120. The logic diagram illustrates the ability of the interface for renewable energy system 7 to switch automatically between the grid tied mode of operation and the off grid mode of operation. The operation of the interface for renewable energy system 7 in accordance with the program stored in the controller 160 is further illustrated with reference to FIGS. 20-23.

Figure 20:
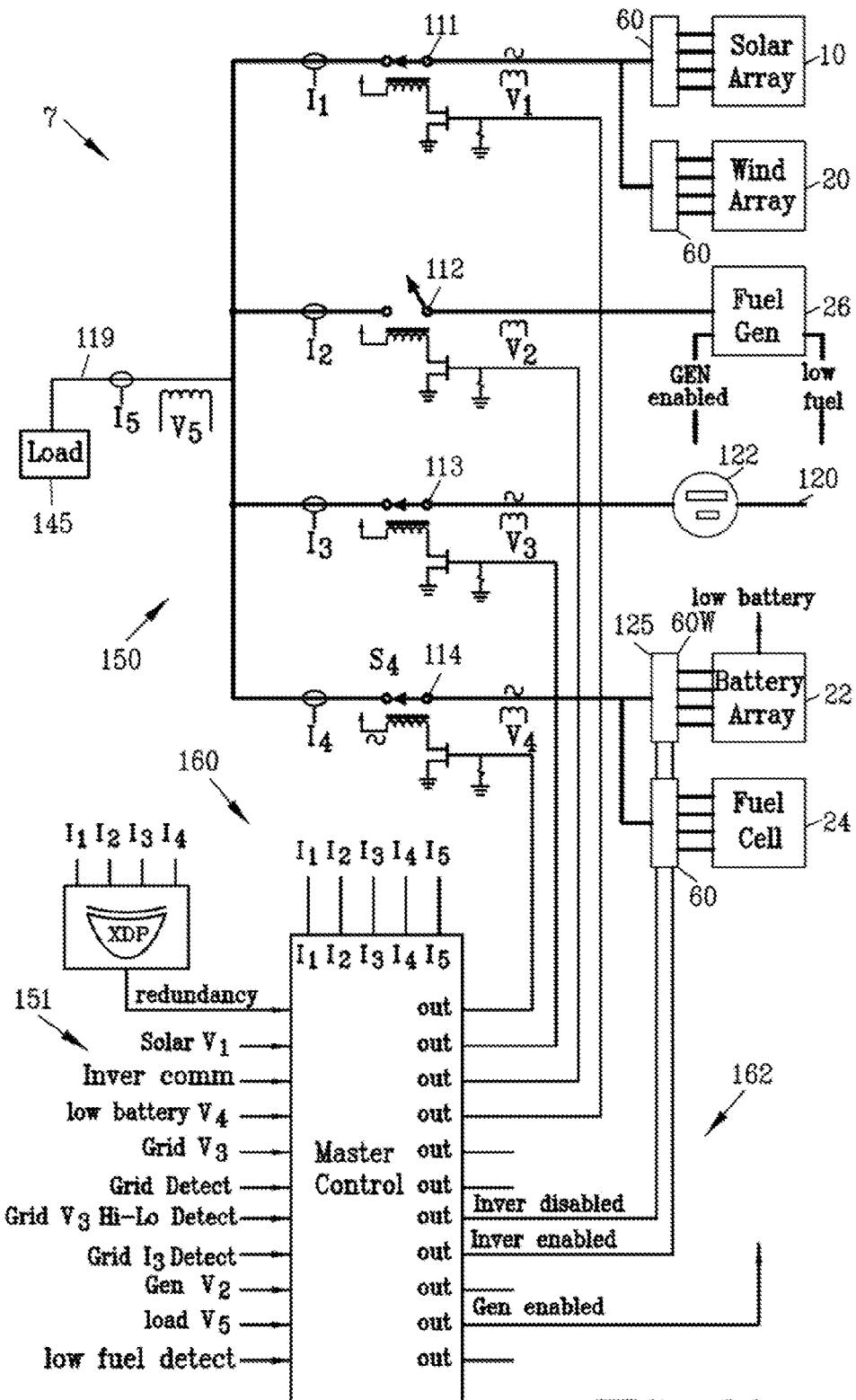
FIG. 20 illustrates a first example of the circuit diagram of the renewable energy system of FIG. 18 in a first electrical grid-tied operating mode.
Figure 21:
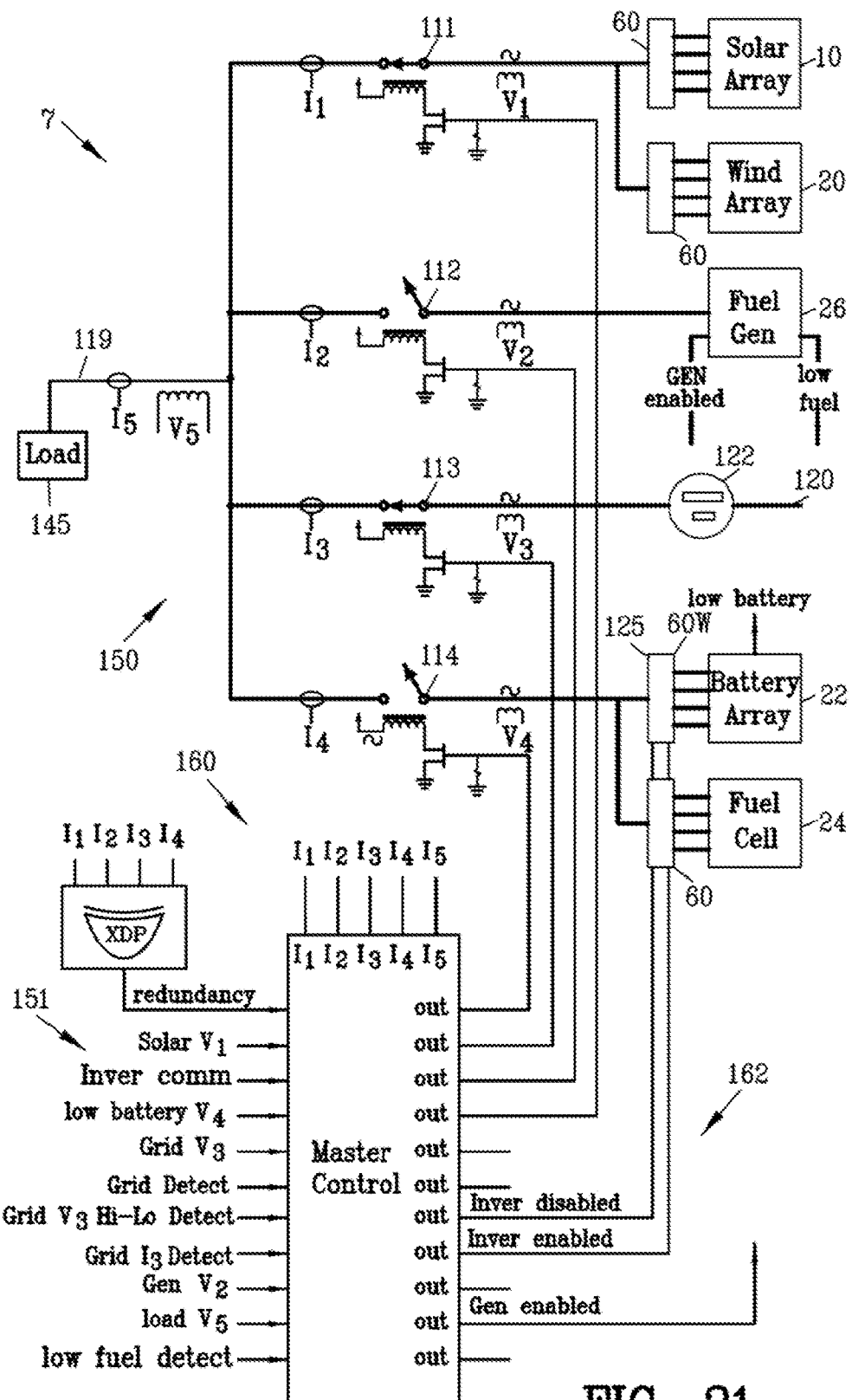
FIG. 21 is a circuit diagram similar to FIG. 20 with the interface for renewable energy system in a second electrical grid-tied operating mode.
Figure 23:
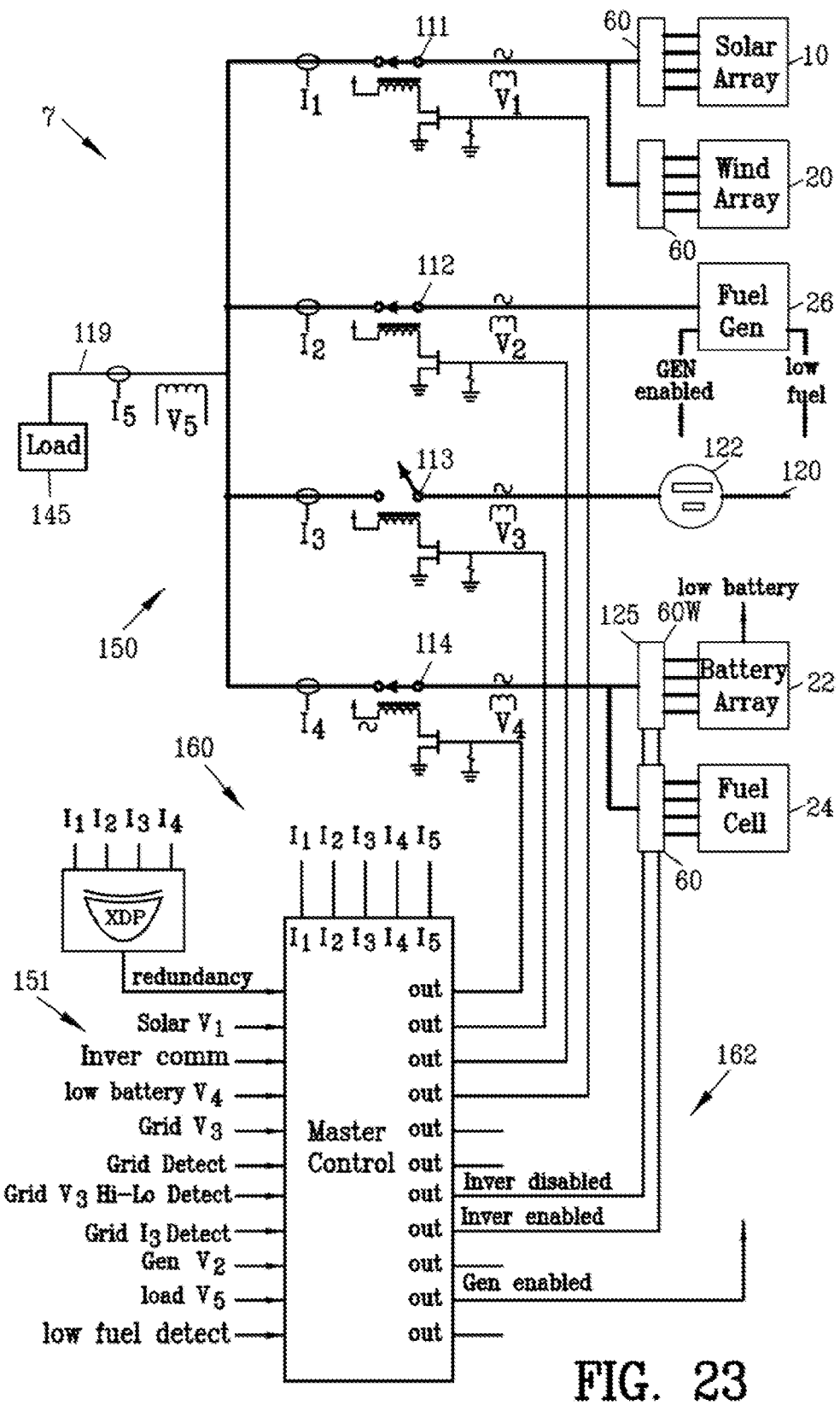
FIG. 23 is a circuit diagram similar to FIG. 20 with the interface for renewable energy system in an emergency operating mode.
Figure 24:
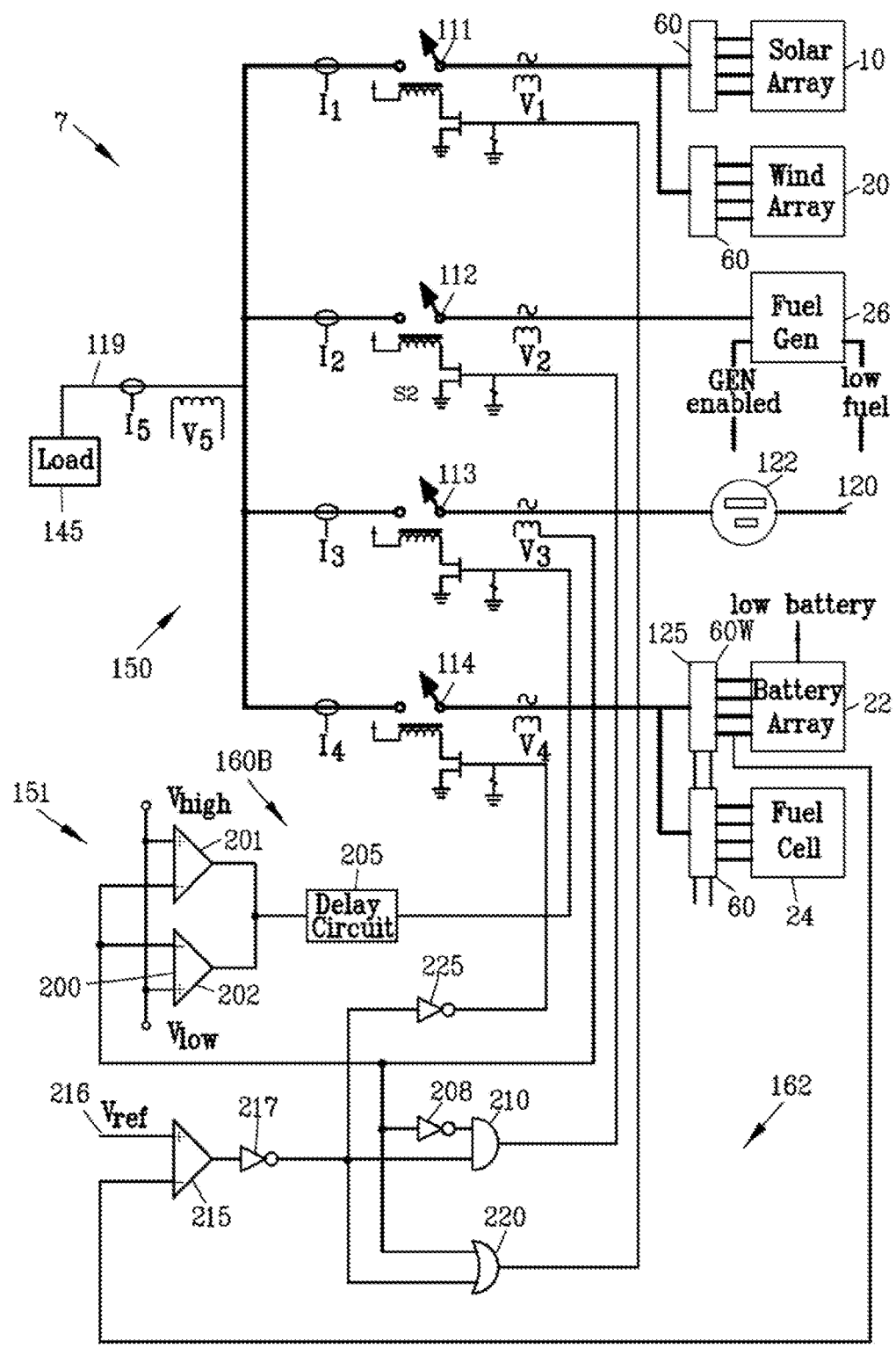
FIG. 24 illustrates a second example of the circuit diagram of the renewable energy system of FIG. 18.

The interface for renewable energy system 7 automatically operates in three modes. FIGS. 20 and 21 illustrate the interface for renewable energy system 7 in a grid tied operation mode. FIG. 23 illustrates the interface for renewable energy system 7 in an off grid operation mode. FIG. 24 illustrates the interface for renewable energy system 7 in an emergency operation mode.

FIG. 20 illustrates a first example of the circuit diagram of the interface for renewable energy system 7 of FIG. 18. Voltage sensors V1-V5 sense the voltage at the switches 111-114 and the load 145. Similarly, current sensors I1-I5 sense the current at the switches 111-114 and the load 145. The controller 160 receives the input from sensors V1-V5 and I1-I5 and provides output to switches 111-114 in accordance with the program stored in the controller 160.

FIG. 20 illustrates the circuit diagram of the interface for renewable energy system 7 in a first electrical grid-tied operating mode wherein AC power is present on the electrical grid 120. The switch 113 is closed for connecting the external electrical grid 120 to the interface for renewable energy system 7. The switch 112 is open for disconnecting the fuel operated generator 26 from the external electrical grid 120. An interlock within the controller 160 prevents the simultaneous closing of switches 112 and 113. Furthermore, switches 112 and 113 may be mechanically interconnected to prevent the simultaneous closing of switches 112 and 113.

Switch 111 is closed enabling the photovoltaic solar panel arrays 10A and 10B and/or the wind turbine 20 to provide renewable AC power to the external electrical grid 120 through closed switch 113. The renewable AC power generated by the multi-channel micro-inverters 60 is maintained in phase with the external electrical grid 120 by the regulators 81 and the controllers 90 within the multi-channel micro-inverter 60. The controllers 90 within the multi-channel micro-inverters 60 monitor the phase of the external electrical grid 120 and control the micro-inverters 60 accordingly.

Switch 114 is closed enabling the photovoltaic solar panel arrays 10A and 10B and/or the external electrical grid 120 to charge the battery array 22. The multi-channel micro-inverter 60W operates as a battery charger for charging the battery array 22. The waveform generator 125 is inactive since the external electrical grid 120 provides a sine wave that is followed in phase by all of the multi-channel micro-inverters 60. The multi-channel micro-inverter 60W operates to recharge the rechargeable fuel cell 24.

FIG. 21 is a circuit diagram similar to FIG. 20 with the interface for renewable energy system 7 in a second electrical grid-tied operating mode. In the event the battery array 22 and/or the fuel cell 24 has obtained maximum charge capacity as indicated by the voltage on V4, the controller 160 opens switch 114 to prevent further charging of the battery array 22 and/or the fuel cell 24.

Figure 22:
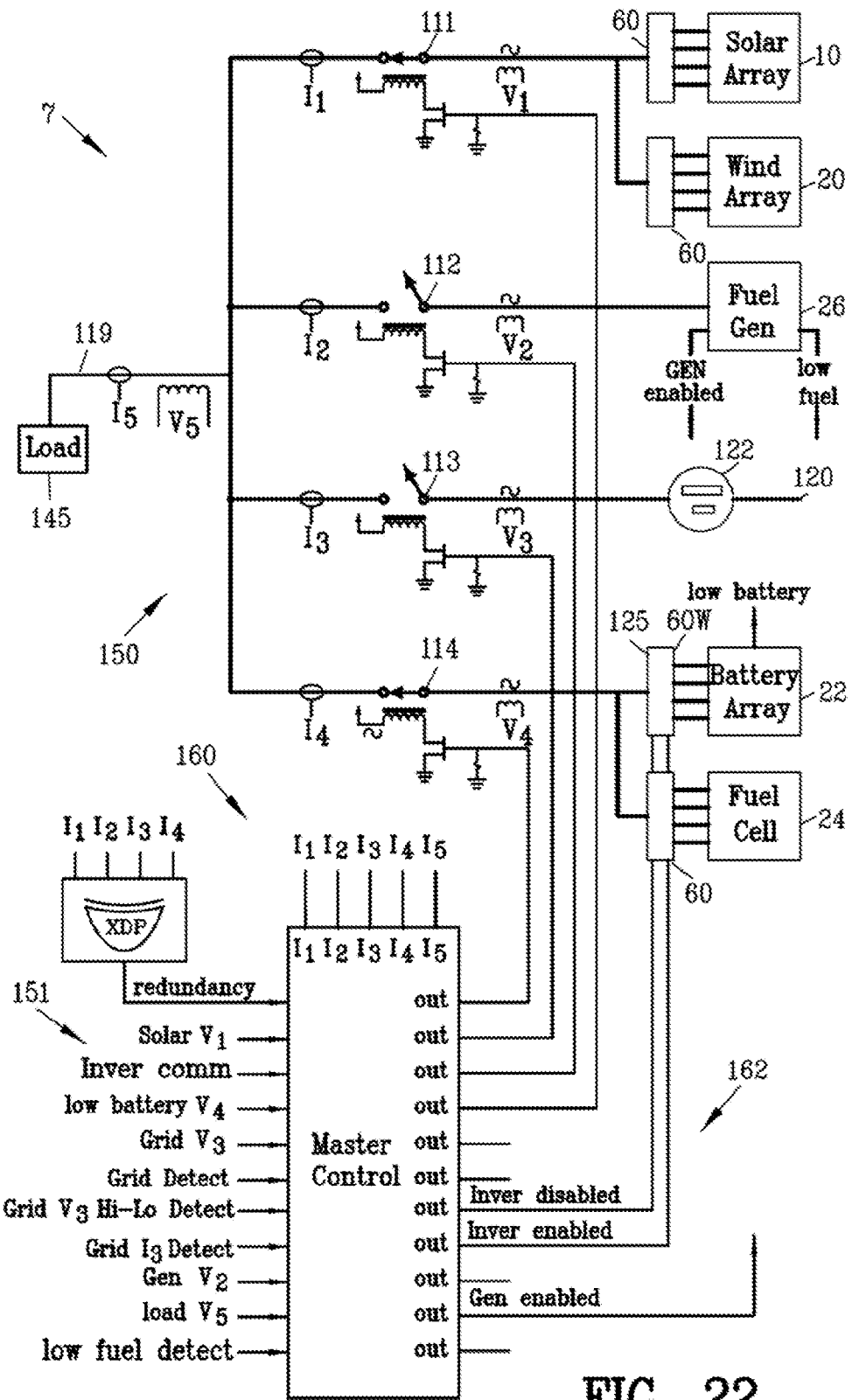
FIG. 22 is a circuit diagram similar to FIG. 20 with the interface for renewable energy system in an off-grid operating mode.

FIG. 22 is a circuit diagram similar to FIG. 20 with the interface for renewable energy system 7 in an off-grid operating mode. Upon the loss of AC power from the external electrical grid 120, the sensor V3 senses the loss of voltage and the controller 160 opens the switch 113 to disconnect the external electrical grid 120 from the interface for renewable energy system 7. Preferably, a time delay is incorporated into the controller 160 for providing a timed duration prior to opening 113 for accommodating for transient voltage fluctuations.

Optionally, the master control 160 may open the switch 113 to disconnect the external electrical grid 120 from the interface for renewable energy system 7 in the event of an over voltage on the external electrical grid 120 thereby protecting the interface for renewable energy system 7 from damage due to an over voltage condition.

Upon opening the switch 113, the controller 160 closes switch 114 and activates the waveform generator 125. The multi-channel micro-inverters 60W converts the DC power from the battery array 22 into AC power following the phase of the waveform generator 125. The AC power from the multi-channel micro-inverters 60W is directed to the load 145.

Switch 111 is closed enabling the photovoltaic solar panel arrays 10A and 10B and/or the wind turbine 20 to provide renewable AC power to the load 145. The renewable AC power generated by the multi-channel micro-inverters 60 is maintained in phase with the waveform generator 125.

In the event the photovoltaic solar panel arrays 10A and 10B and/or the wind turbine 20 provide more electrical power than required by the load 145, then the controller 160 enables the multi-channel micro-inverter 60W to charge the battery array 22 and/or the rechargeable fuel cell 24. In the event the battery array 22 and/or the fuel cell 24 has obtained maximum charge capacity as indicated by the voltage on V4, the controller 160 opens switch 114 to prevent further charging of the battery array 22 and/or the fuel cell 24. In the alternative, the controller 160 may open switch 111 to disconnect the photovoltaic solar panel arrays 10A and 10B and/or the wind turbine 20 and close switch 114 to dissipate excessive charge in the battery array 22 and/or the fuel cell 24 to the load 145.

The photovoltaic solar panel arrays 10A and 10B and/or the wind turbine 20 work in concert with the battery array 22 and/or the rechargeable fuel cell 24 for providing reliable AC power to the load. In the event photovoltaic solar panel arrays 10A and 10B and/or the wind turbine 20 provide less electrical power required by the load 145 due to clouds, nightfall or the absence of wind, the battery array 22 and/or the rechargeable fuel cell 24 provides supplemental AC power to the load. The switch 112 remains open keeping the fuel operated generator 26 disconnected from the interface for renewable energy system 7 until the depletion of the stored DC power in the battery array 22.

FIG. 23 is a circuit diagram similar to FIG. 20 with the interface for renewable energy system 7 in an emergency operating mode. An emergency condition exists when the (1) the loss of AC power from the external electrical grid 120, (2) the inability of the photovoltaic solar panel arrays 10A and 10B and/or the wind turbine 20 to provide sufficient AC power to the load 145 and (3) the depletion of DC power stored in the battery array 22 and/or the rechargeable fuel cell 24 simultaneously exists.

In the emergency operational mode, the controller 160 terminates operation of the waveform generator 125. The controller 160 closes switch 112 and actuates the fuel operated generator 26. The fuel operated generator 26 provides emergency power to the load 145 as well as AC power to charge the battery array 22 and/or the rechargeable fuel cell 24.

In the event, the DC power from the photovoltaic solar panel arrays 10A and 10B and/or the wind turbine 20 is restored, the controller 160 terminates operation of the fuel operated generator 26, opens switch 112 and activates the waveform generator 125 to return to the off-grid operating mode as heretofore described.

When the AC power from the external electrical grid 120 is restored, the controller 160 returns the switches 111-114 to the positions shown in FIG. 20 with the waveform generator 125 in a deactivated condition. It should be appreciated that the interface for renewable energy system 7 switches automatically between the grid tied operation mode, an off grid operation mode and the emergency operation mode while still meeting electrical safety standards.

FIG. 24 illustrates a second example of the circuit diagram of the renewable energy system 7 of FIG. 18. In this example, the controller 160B is a hard wired electrical circuit void of programmable electronic components. The voltage sensor V3 senses the voltage from the external electrical grid 120. The output of the voltage sensor V3 is applied to a window comparator 200 having comparators 201 and 202. The output of the window comparator 200 is connected to the switch 113 through delay circuit 205. The delay circuit 205 eliminates transient voltages on the external electrical grid 120 from changing the switch 113.

A proper voltage of the external electrical grid 120 produces a high output from the window comparator 200 to close switch 113. An over voltage or an under voltage of the external electrical grid 120 produces a zero output from the window comparator 200 to open switch 113.

The voltage sensor V3 is also connected through an inverter 208 to an AND gate 210. The output of AND gate 210 is connected to control switch 112. A proper voltage of the external electrical grid 120 produces a low output from the AND gate 210 to open switch 112.

A comparator 215 compares a reference DC voltage 216 with the voltage of the battery array 22. The output of the comparator 215 is applied through an inverter 217 to the AND gate 210. The AND gate 210 closes switch 112 only upon (1) the loss of voltage of the external electrical grid 120 and (2) the voltage of the battery array 22 is below the reference voltage 216.

The output of the comparator 215 is applied through an inverter 217 to an OR gate 220. The OR gate 220 receives an input from the voltage sensor V3. The output of OR gate 220 is connected to control switch 111. The OR gate 220 closes switch 111 when (1) a proper voltage appears on the external electrical grid 120 or (2) the voltage of the battery array 22 is below the reference voltage 216.

The output of the comparator 215 is applied through the inverter 217 and inverter 225 to control switch 114. The comparator 215 closes switch 114 when the voltage of the battery array 22 is below the reference voltage 216.

An example of switching circuit suitable for fuel operated generator switch 112 and the external electrical grid switch 113 is disclosed in U.S. Pat. No. 8,134,820 which is incorporated by reference as if fully set forth herein.

Figure 25:
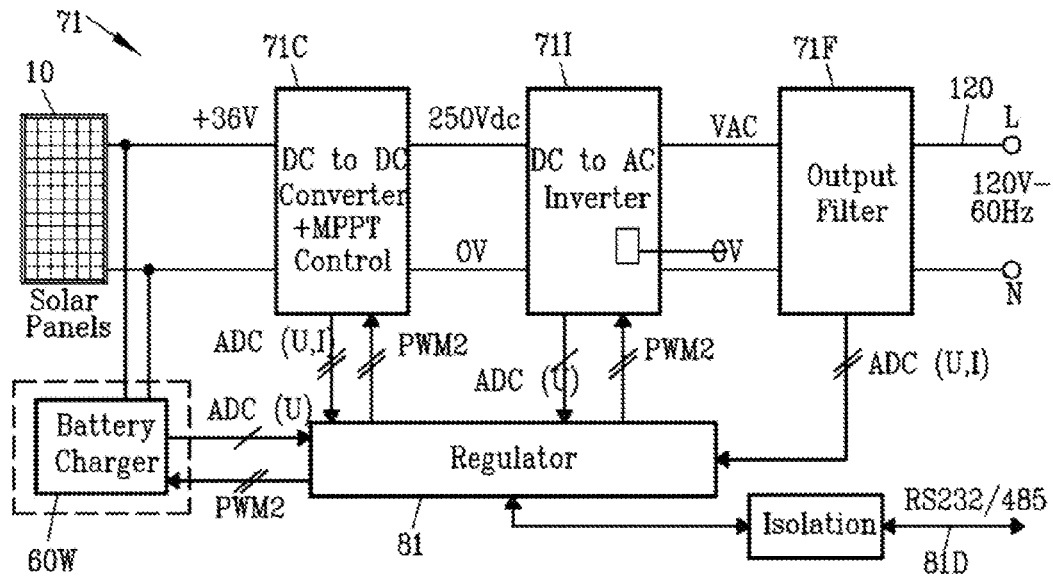
FIG. 25 is a block diagram of the micro-inverter circuit of the present invention.
Figure 26:
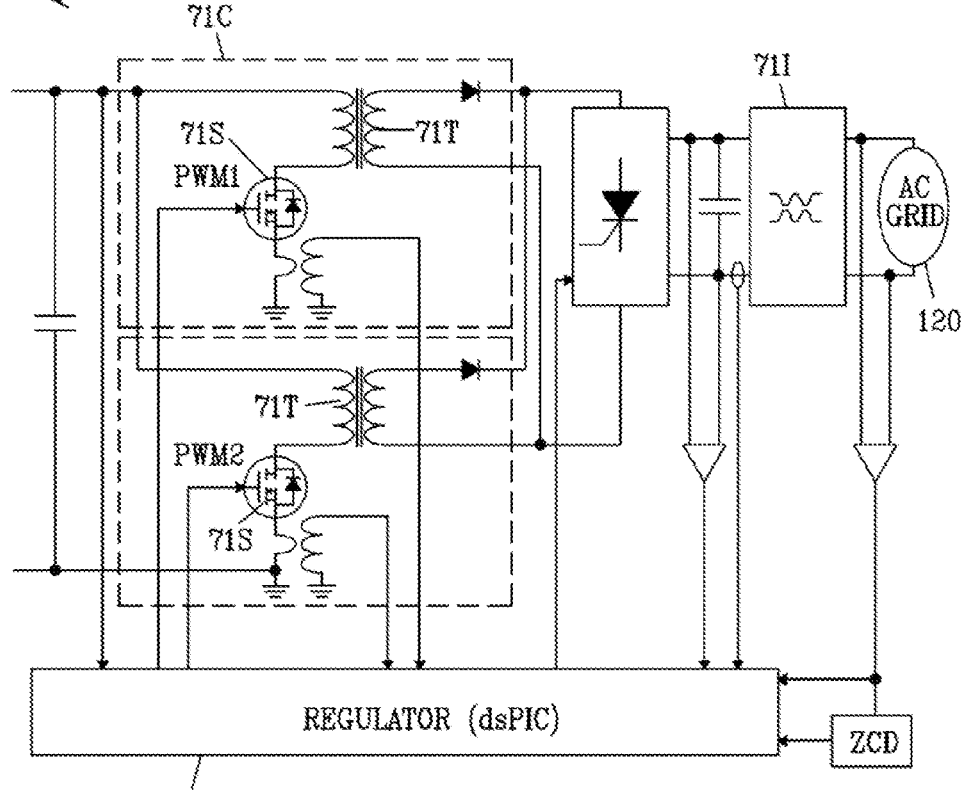
FIG. 26 is a circuit diagram of the micro-inverter circuit of FIG. 25.

FIGS. 25 and 26 are a block diagram and a simplified circuit diagram of a micro-inverter 71 suitable for use with the present invention. The micro-inverter 71 described is a grid-connected solar micro-inverter reference design using a dsPIC digital signal controller (AN1338).

The micro-inverter 71 comprises a DC to DC converter 71C comprising plural switches 71S and plural transformers 71T. The DC power input from the solar array 10 is applied to primary windings of each of the plural transformer 71T. The plural switches 71S are connected in series with the plural transformer 71T, respectively. The plural switches 71S are controlled by the regulator 81. Each of the plural switches 71S produces a pulsating DC waveform in the shape of a positive half cycle of an AC waveform. The regulator 81 controls the plural switches 71S to produce pulsating DC waveforms having an elevated voltage and one hundred and eighty degrees out of phase with one another. Each of the pulsating DC waveforms is elevated in voltage. The regulator 81 controls the plural switches 71S to produce maximum power output from the voltage-current output curve of the solar array 10. A complete technical discussion of the dsPIC digital signal controller (AN1338) manufactured by Microchip Technology Inc. may be found in technical bulletin for the dsPIC digital signal controller (AN1338) which is hereby incorporated by reference as if fully set forth herein.

The regulator 81 is able to throttle back the output of the micro-inverter 71 by the electrical monitor controller (EMC) 170 communicating through the internet 180 for remotely entering instruction into the controllers 90 of the multi-channel micro-inverters 60. In some instances, too much renewable energy power is introduced into the external electrical grid 120. The electrical monitor controller (EMC) 170 enables an external source such as an electrical power company to throttle back the regulators 81 to reduce the amount of the renewable energy power introduced into the external electrical grid 120.

Figure 27:
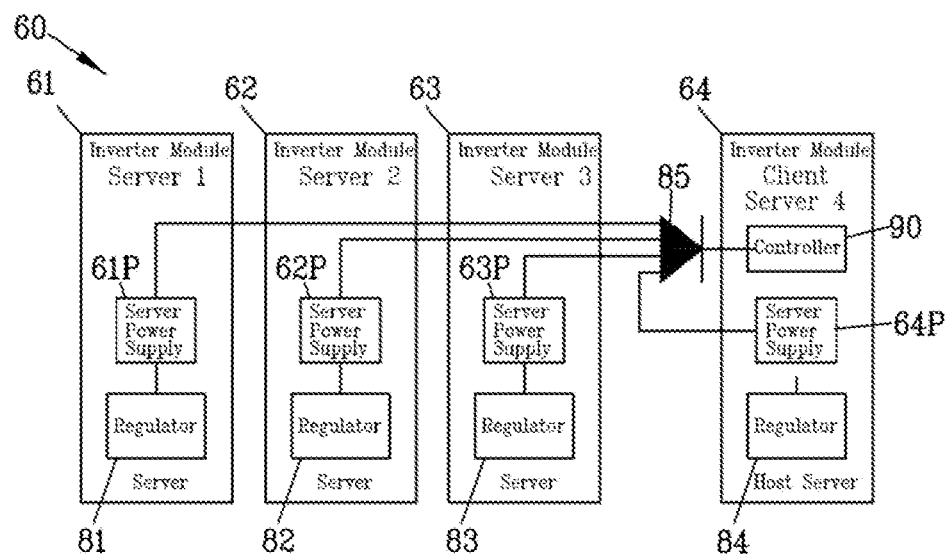
FIG. 27 is a block diagram illustrating a redundant power supply for the controller of the multi-channel micro-inverter.

FIG. 27 is a block diagram illustrating a redundant power supply 65P for the controller 90 of the multi-channel micro-inverter 60. Each of the inverters 81-84 includes a power supply 61P-64P. Each of the power supplies 61P-64P is connected to a diode OR gate 85 to provide power to the controller 90. In the event one or more of the power supplies 61P-64P and/or solar panels 11-14 should fail, the remaining power supplies 61P-64P will still provide power to the controller 90.

Figure 28:
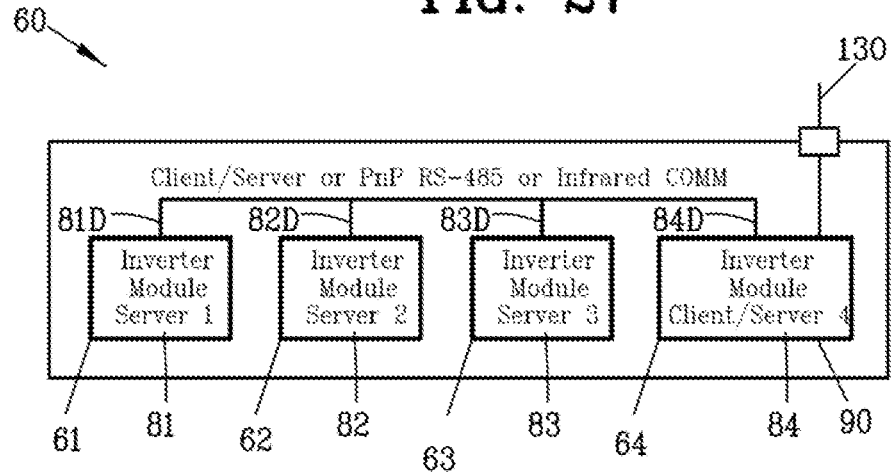
FIG. 28 is a block diagram illustrating a controller communicating with the plurality of micro-inverters circuits.

FIG. 28 is a block diagram illustrating a controller 90 communicates with the plurality of micro-inverters circuits 61-64. The controller 90 communicated with each of the regulators 81-84 through the data cables 81D-84D. The data cables 81D-84D may be a PnP, RE-485 or infrared (IR) communication systems. The controller 90 monitors and provides instructions to each of the micro-inverters circuits 61-64. However, each of the micro-inverters circuits 61-64 operates independently of the remaining micro-inverters circuits 61-64.

Figure 29:
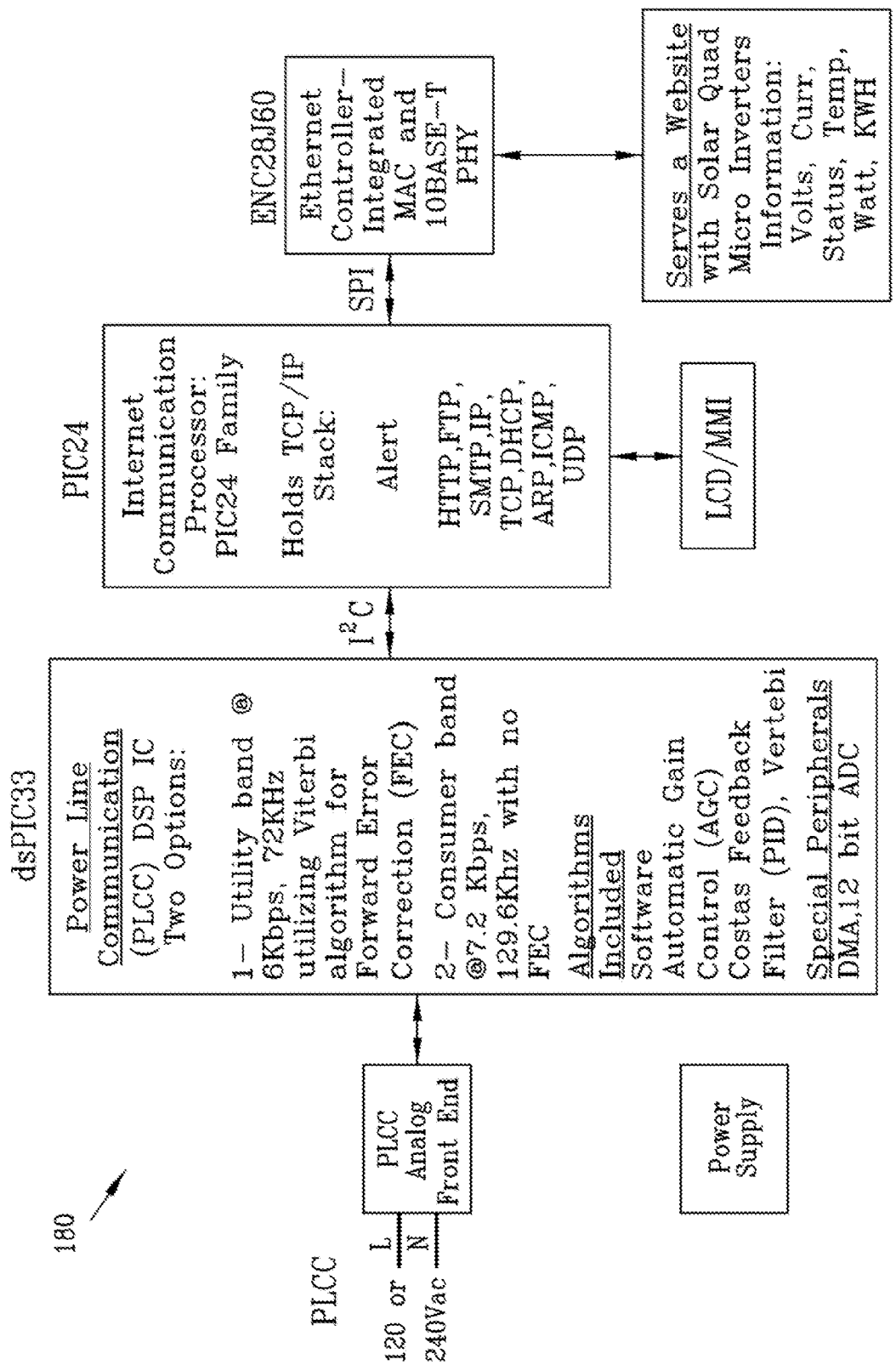
FIG. 29 is a block diagram illustrating a master communication system for communication with the controller of the plurality of micro-inverters circuits.

FIG. 29 is a block diagram illustrating the electrical monitor controller (EMC) 170 for communication with the controller 90 of the plurality of multi-channel micro-inverters circuits 60. Lines labeled "L" (Line) and "N" (neutral) are use as media to carry analog data to and from the micro-inverters 61-64 installed at or near the solar collectors 11-14.

The digital signal controller (dsPIC33) is an Analog-to-Digital Converter, converting either a Utility Band operating at 6 Kbps (kilobits per second), 72 Khz (kilohertz) utilizing Forward Error Correction (FEC) or a Consumer Band operating at 7.2 Kbps, 129.6 Khz with no Forward Error Correction. The digital signal controller is also referred to as a Peripheral Interface Controller or a Programmable Intelligent Computer.

Figure 30:
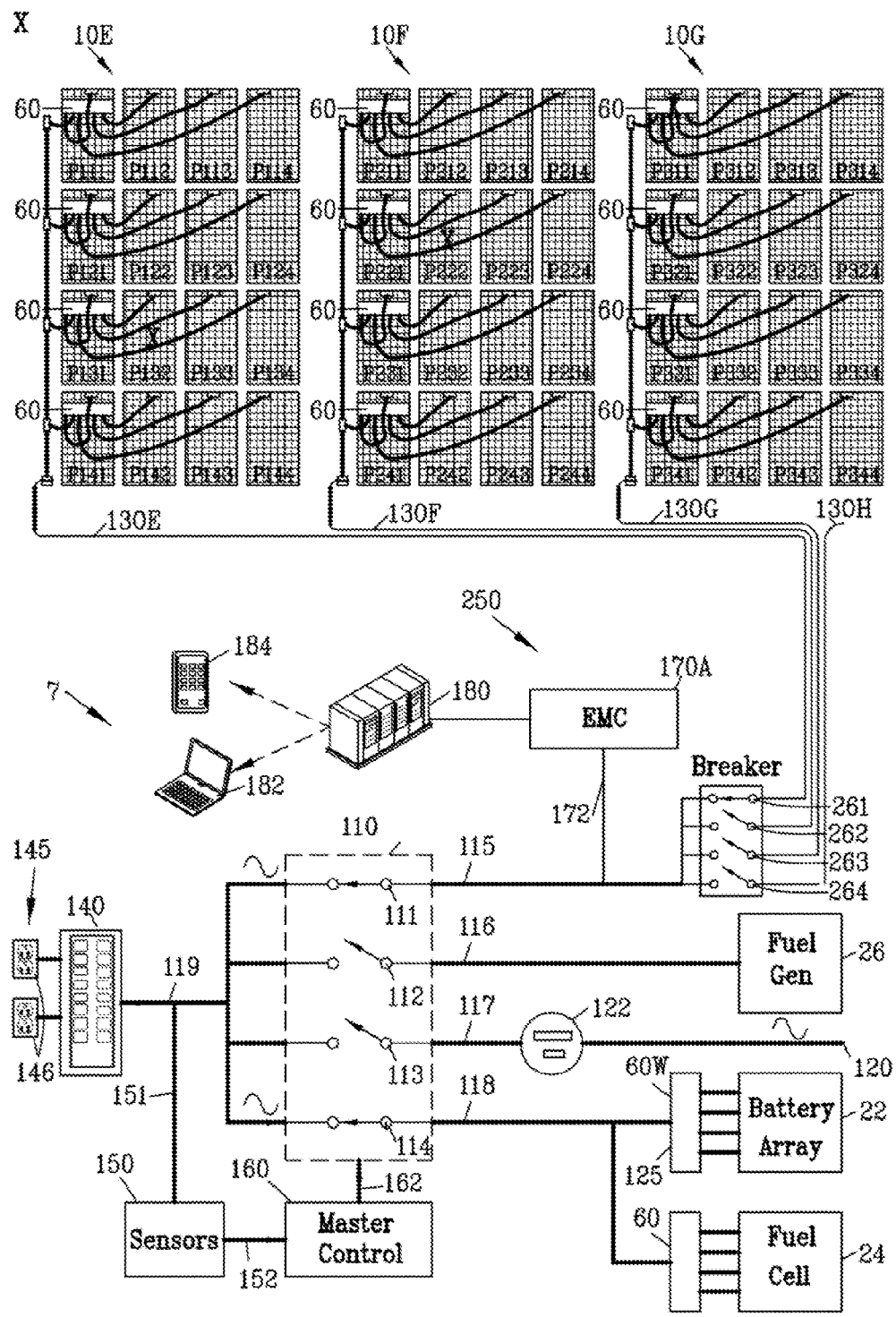
FIG. 30 is a diagram of similar to FIG. 18 illustrating an apparatus for identifying a performance and/or fault in a solar panel of a solar panel array incorporated into the renewable energy system of the present invention.

The micro inverters 60 installed at or near the solar collectors send data such as current output, watt output in an analog form which is first received by the PLCC Analog Front End. The PLCC receives the signal that has been transmitted though the power lines to create an analog signal that the dsPIC33 can further process. The dsPIC33 sends analog data to and from the micro inverters 60. Once the dsPIC33 has received some analog data from the micro inverters 60, the dsPIC33 then can send and receive digital data to and from the PIC24 via I²C. The I²C is an Inter-Integrated Circuit bus connecting the dsPIC33 to the PIC24. The PIC24 is a microcontroller where instructions are stored in the non-volatile memory called Program Memory the data from the dsPIC33 is stored in the PIC24's Data Memory. The instructions (programs) stored and executed by the PIC24 include HTTP (Hypertext Transfer Protocol), FTP (File Transfer Protocol), SMTP (Simple Mail Transfer Protocol), IP (Internet Protocol), TCP (Transmission Control Protocol), DHCP (Dynamic Host Configuration Protocol), ARP (Address Resolution protocol), ICMP (Internet Control Message Protocol), and UDP (User Datagram Protocol). The HTTP (web server) instructions stored in the PIC24's Program Memory gives technicians or homeowners the ability to input and see real time information, such as, power outputs, temperature, and status of the system, using a standard web browser. The SMTP server gives the unit the ability to send emails to a technician or homeowner when specified events have or will occurred, such as a failure in one of the system components (solar panel, micro inverter, grid power loss, grid power low, grid power restored, etc). The PIC24 is programmed to handle TCP/IP stack which allows for the remote communication using a Network Interface Controller (ENC28J60 in diagram). The Network Interface Controller converts instructions to be transmitted over a physical transmission media, such as cabling (electric voltages), wireless (radio frequencies) and/or infrared (pulses of infrared or ordinary light) to be delivered to ultimately another Ethernet controller. The remote computer with an installed Ethernet controller can then view the programs running on the PIC24, such as HTTP to remotely view real time data including current Volts, Current output, Status of the system, Temperature of the system, Watts and Kilowatt Hours being produced. The PIC24 also includes a direct input and output to and LCD/MMI Message Center Display FIG. 30 is a diagram of similar to FIG. 18 illustrating an apparatus 250 for mapping and identifying a performance and/or fault in a solar panel of a solar panel array. The solar arrays have a multiplicity of solar panel groups with each solar panel groups having a plurality of solar panels mounted in a specific physical pattern. In this example, three solar panel arrays 10E-10G arranged in alphabetical order. The first solar panel arrays 10E comprise four groups of solar panels. The first group includes solar panels P111-P114, the second group includes solar panels P121-P124, the third group includes solar panels P131-P134 and the fourth group includes solar panels P141-P144.

In a similar manner, the second solar panel arrays 10F comprise four groups of solar panels including solar panels P211-P214, the second group includes solar panels P221-P224, the third group includes solar panels P231-P234 and the fourth group includes solar panels P241-P244.

The third solar panel arrays 10G comprise four groups of solar panels including solar panels P311-P314, the second group includes solar panels P321-P324, the third group includes solar panels P331-P334 and the fourth group includes solar panels P341-P344.

Each of the groups of solar groups of solar panels includes a micro-inverter 60. The micro-inverters are secured to a single and identifiable solar panel of each of the solar panel groups. In this example, the micro-inverters 60 are secured to the first solar panel each of the groups of each of the solar arrays 10E-10G.

Micro-inverters 60 are secured to the first solar panel P111, P121, P131 and P141 of the solar panel array 10E. Micro-inverters 60 are secured to the first solar panel P211, P221, P231 and P241 of the solar panel array 10F. Micro-inverters 60 are secured to the first solar panel P311, P321, P331 and P341 of the solar panel array 10G.

Figure 31:
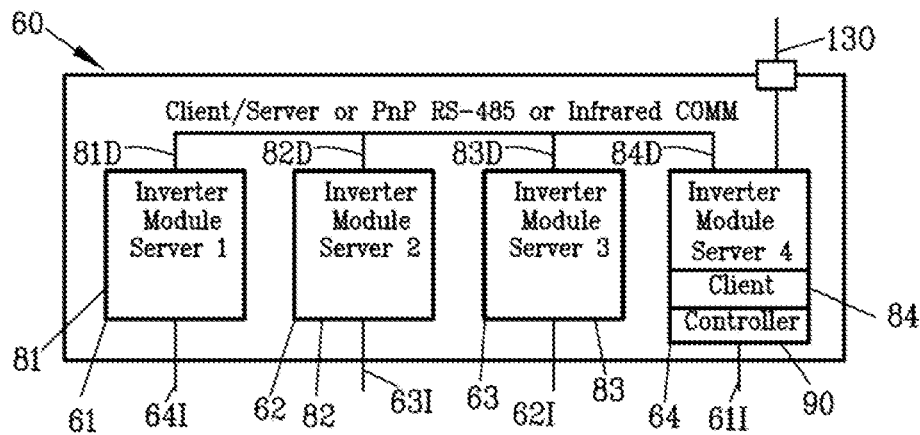
FIG. 31 is a block diagram similar to FIG. 27 illustrating a client controller within the micro-inverter circuit.

FIG. 31 is a block diagram similar to FIG. 27 illustrating the micro-inverters 60. Each of the micro-inverters 60 has a unique identification numeral for the micro-inverter 60 and with each of the micro-inverters 60 having numbered inverter ports. In this example, each of the micro-inverters 60 has four numbered inverter ports 61I-64I for connection to four solar panels in the solar panel group.

The micro-inverter 60 includes the client controller 90 that communicates with the plurality of regulators 81-84 for monitoring and setting the parameters of the operation of the independent micro-inverters 71-74. In addition, the controller 90 communicates with the plurality of regulators 81-84 for monitoring the operation of the photovoltaic solar panels connected to the inverter ports 61I-64I.

Referring back to FIG. 30, a plurality of cables connect the solar panels to specific numbered inverter ports of the micro-inverter 60 for correlating the numbered inverter ports to specific physical locations of the plurality of solar panels within each of the solar panel groups.

Preferably, the solar panels of a group are mounted in a pre-established specific physical pattern based on a length of the cables connecting the solar panels to the numbered inverter ports of the micro-inverter 60. In this example, the micro-inverters 60 secure to solar panel P111 has numbered inverter ports 61I-64I (1, 2, 3 and 4) connected to solar panels (P111, P112, P113 and P114), respectively. Thus, the cables connected to numbered inverter port 61I-64I (1-4) range from the shortest to the longest cable with numbered inverter port 61I (1) being the shortest and numbered inverter port 64I (4) being the longest. The remaining inverters 60 secure to solar panel P111-P344 of the solar arrays 10E-10G and are connected in as similar manner as shown in FIG. 30.

A first trunk line 13OE connects the micro-inverters 60 of the first solar array 10E to a first circuit breaker 261. Similarly, a second and a third trunk line 13OF and 13OG connect the micro-inverters of the second and third solar arrays 10F and 10G to a second and a third circuit breaker 262 and 263. A fourth trunk line 13OH is shown for connection to a micro-inverter of another renewable energy source such as the windmill 20 shown on FIG. 18. The first through fourth breakers 261-264 are connected to the EMC 170A shown and described with reference to FIG. 20.

Figure 32:
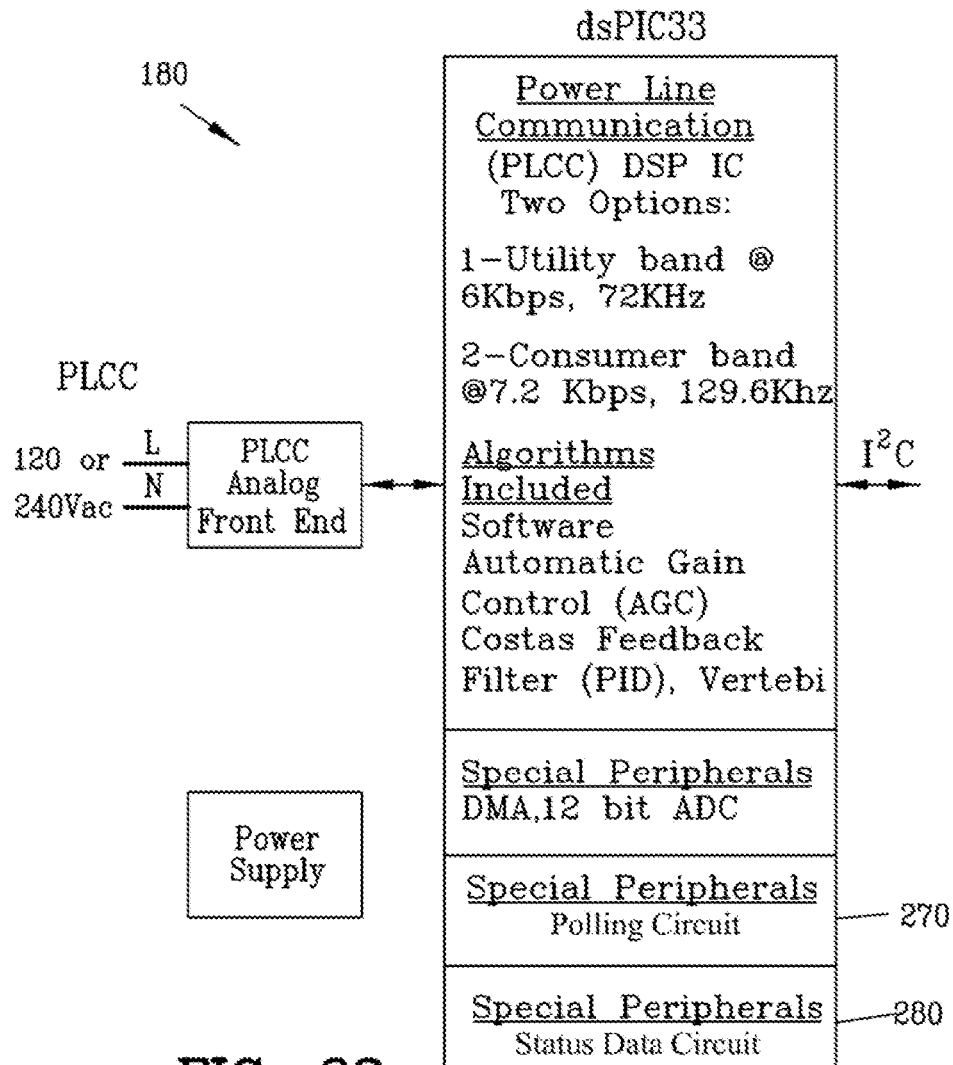
FIG. 32 is a block diagram of a portion of FIG. 29 illustrating a polling circuit and a status and data circuit.

FIG. 32 is a block diagram of a portion of the electrical monitor controller (EMC) 170A of FIG. 29 illustrating a polling circuit 270 and a status and data circuit 280. The controller 90 of the micro-inverters 60 of the first, second and third arrays 10E-10G are connected through breakers 261-263 to the polling circuit 270 and the status and data circuit 280 of the electrical monitor controller (EMC) 170A.

The polling circuit 270 generates a first polling signal upon closing the first circuit breaker 261 for enabling the controller 90 of each of the micro-inverters 60 of the first solar array 10E to transmit the identification numeral and the numbered inverter ports. Similarly, the polling circuit 270 generates a second polling signal upon closing the second circuit breaker 262 for enabling the controller 90 of each of the micro-inverters 60 of the second solar array 10F to transmit the identification numeral and the numbered inverter ports.

The polling circuit 270 generates a third polling signal upon closing the third circuit breaker 263 for enabling the controller 90 of each of the identification numeral of the third solar array 10G to transmit the identification numeral and the numbered inverter ports.

FIG. 33 is a table illustrates the polling and the identification of the micro-inverters 60 of the solar arrays 10E-10G. Column B1, B2 and B3 correspond to circuit breakers 261, 262 and 263, respectively. The time column indicates the elapsed time from the closing of the respective breaker B1-B3. The columns labeled solar panel array 1 identify the solar panels P111 to P141 connected to the numbered inverter ports (1, 2, 3 and 4) secure to the micro-inverters 60. Below the solar panels identifiers P111 to P141 are the last four digits of the identification numeral of the respective micro-inverter 60. The columns labeled solar panel array 2 identify the solar panels P211 to P241 connected to the numbered inverter ports (1, 2, 3 and 4) secure to the micro-inverters 60. Below the solar panels identifiers P211 to P241 are the last four digits of the identification numeral of the respective micro-inverter 60. The columns labeled solar panel array 3 identify the solar panels P311 to P341 connected to the numbered inverter ports (1, 2, 3 and 4) secure to the micro-inverters 60. Below the solar panels identifiers P311 to P341 are the last four digits of the identification numeral of the respective micro-inverter 60.

Upon the closing of first breaker 261, the polling circuit 270 generates a first polling signal for enabling the controller 90 of each of the micro-inverters 60 of the first solar array 10E to transmit the identification numeral and the numbered inverter ports. Each of the micro-inverters 60 responds to the first polling signal based on a time elapse corresponding to the last four digits of the identification numeral of the respective micro-inverter 60. In this example, the micro-inverter 60 secured to solar panel P111 having the last four digits of the identification numeral (1084) responds (R1) after an elapsed time 1084 clock cycles after the closing of the first breaker 261.

After the micro-inverter 60 responds to the first polling signal, the identification numeral (1084) of the micro-inverter 60 secured to solar panel P111 is registered (R2) by the status and data circuit 280.

The micro-inverter 60 secured to solar panel P121 having the last four digits of the identification numeral (3187) responds (R1) after an elapsed time 3187 clock cycles after the closing of the first breaker 261. The micro-inverter 60 secured to solar panel P131 having the last four digits of the identification numeral (6123) responds (R1) after an elapsed time 6123 clock cycles after the closing of the first breaker 261. The micro-inverter 60 secured to solar panel P141 having the last four digits of the identification numeral (9854) responds (R1) after an elapsed time 9854 clock cycles after the closing of the first breaker 261.

Upon the closing of second breaker 262, the polling circuit 270 generates a second polling signal for enabling the controller 90 of each of the micro-inverters 60 of the second solar array 10F to transmit the identification numeral and the numbered inverter ports. In this example, the micro-inverter 60 secured to solar panel P211 having the last four digits of the identification numeral (1297) responds (R1) after an elapsed time 1297 clock cycles after the closing of the second breaker 262. After the micro-inverter 60 responds to the second polling signal, the identification numeral (1297) of the micro-inverter 60 secured to solar panel P211 is registered (R2) by the status and data circuit 280. The remaining micro-inverter 60 in the second panel array 10F responds in a similar manner. The micro-inverter 60 in the third panel array 10G respond in a similar manner upon closing the third breaker 263.

The status and data circuit 280 stores values of the identification numeral and the numbered inverter ports to monitor the solar arrays 10E-10G upon closing all of the circuit breakers 261-263. The controller 90 of each of the micro-inverters 60 communicates with the status and data circuit 280 for monitoring the operation of the photovoltaic solar panels in each of the solar arrays 10E-10G.

The status and data circuit 280 for generating a status output containing an identification numeral and a numbered inverter ports of a performance and/or fault detected in a solar panel for enabling an operator to determining the physical location of a performance and/or faulty solar panel from the identification numeral and the numbered inverter ports of the performance and/or faulty solar panel and based upon the original specific physical pattern of the plurality of solar panels of the solar panel group.

FIG. 34 is a table of illustrating an output of the status and data circuit 280 illustrating the status of the solar panels in the first, second and third solar arrays 10E-10G. The table is shown as a specific example of an output from the status and data circuit 280 and numerous other types of outputs are suitable for the status and data circuit 280. For example, the output from the status and data circuit 280 may be generated from a computer screen, printer, cellular phone screen, tablet and the like.

In this example, the output from the status and data circuit 280 shows a first performance and/or fault in solar panel P132 in the first solar panel array 10E. Knowing solar panel P132 is performance and/or faulty, an operator can refer back to the pre-established specific physical pattern of the solar arrays 10E.-10G. The first number (1) of the solar panel P132 indicates to the operator the performance and/or faulty solar panel P132 is located in solar array 10E. The second number (3) of the solar panel P132 indicates to the operator the performance and/or faulty solar panel P132 is located in group 3 and the third number (3) of the solar panel P132 indicates to the operator the performance and/or faulty solar panel P132 is located in the second position in the group. The third number (3) of the solar panel P132 also indicates the solar panel P132 as the second shortest length of cable to the micro-inverter 60.

FIG. 35 is a table illustrating a second performance and/or fault of a solar panel P222 in the second solar panel array 10F. The first number (2) of the solar panel P222 indicates to the operator the performance and/or faulty solar panel P222 is located in solar array 10F. The second number (2) of the solar panel P222 indicates to the operator the performance and/or faulty solar panel P222 is located in group 2 and the third number (2) of the solar panel P222 indicates to the operator the performance and/or faulty solar panel P222 is located in the second position in the group. The third number (2) of the solar panel P222 also indicates the solar panel P132 as the second shortest length of cable to the micro-inverter 60.

FIG. 36 is a table illustrating a third performance and/or fault of a micro-inverter 60 in the third array 10G. The table of FIG. 36 shows a performance and/or fault of solar panels P311-P314 indicating a total loss of power from a solar cell panel group. The loss of power from a solar panel group is indicative of a catastrophic failure of the all solar panels P311-P314 and/or the loss of the respective micro inverter 60. In addition, the failure of a micro-inverter 60 will cease communication between the control 90 I the micro-inverter 60 and the e electrical monitor controller (EMC) 170A. The apparatus 250 for mapping and identifying a performance and/or faulty solar panel of a solar panel array provides a simple and straightforward method for determining the physical location of the performance and/or faulty solar panel within the solar panel array.

According to various embodiments, the micro-inverter boards 61-64 may be further configured to intelligently control energy harvest from their respective photovoltaic solar panels 11-14 based on one or more adjustable, user-defined variables. For example, in various embodiments, each micro-inverter board's regulator 81-84 is configured to monitor the operating temperature of its micro-inverter 71-74 and control the power harvested from its associated panel 11-14 in order to ensure the operating temperature of the micro-inverter 71-74 does not approach a level that would damage the micro-inverter's circuitry or other components (e.g., a maximum threshold temperature value defined by the user). In further embodiments, each micro-inverter's regulator 81-84 is also configured to monitor the total harmonic distortion of the micro-inverter's AC power output (e.g., via the outputs 61O-64O) and control the power harvested from its associated panel 11-14 in order to ensure the total harmonic distortion of the AC power output does not exceed an threshold level (e.g., a maximum total harmonic distortion value defined by the user). Similarly, a user may define a maximum power threshold to cap the amount of power harvested from the panels 11-14 at any given time in order to manually throttle the micro-inverters 71-74.

Figure 37:
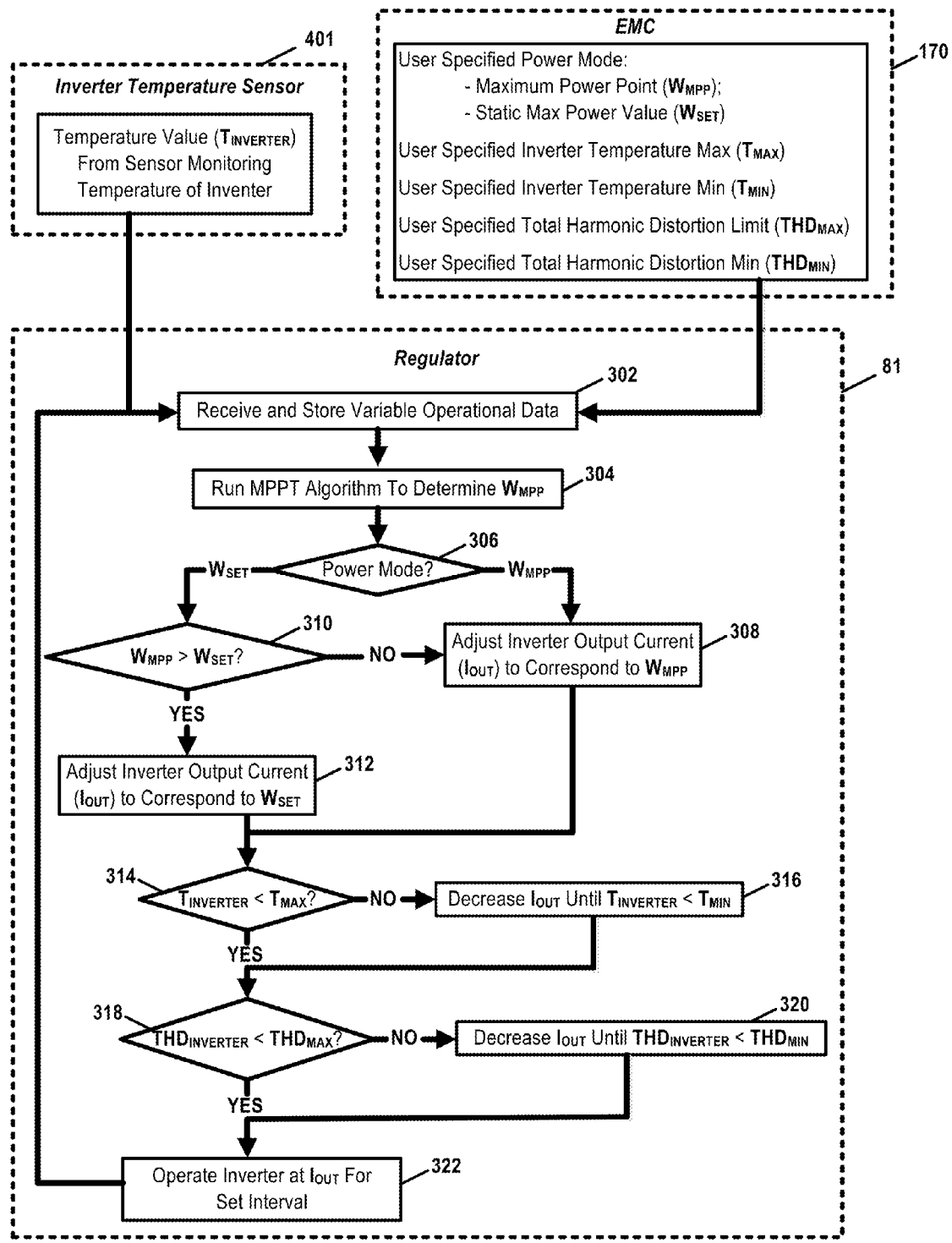
FIG. 37 is a flow chart diagram showing steps executed by a micro-inverter regulator in regulating the power output of its micro-inverter.

Using the regulator 81 of the micro-inverter board 61 as an example, FIG. 37 illustrates a flow chart showing steps executed by the regulator 81 in regulating the power output of its micro-inverter 71. As noted earlier herein, the regulator 81 is a microcontroller (e.g., a dsPIC digital signal controller (AN1338) manufactured by Microchip Technology Inc.) configured for controlling the operation of its micro-inverter 71. The regulator 81 communicates through the inter micro-inverter network protocol (e.g., an RS-485 data link or an optical link) with the controller 90, which itself communicates with a remote electrical controller (EMC) 170 via the internet 180. As such, the regulator 81 is able to process operational data provided remotely to the EMC 170 (e.g., data from one or more sensors monitoring the micro-inverter 71 and user input indicating one or more user specifications provided via a user computer 182 or mobile device 184 in communication with the EMC 170).

Beginning at step 302, the regulator 81 first receives and stores operational data from various operational data sources. In the illustrated embodiment, these operational data sources include a micro-inverter temperature sensor 401, which continuously transmits data indicative of the current operating temperature of the micro-inverter 71 to the regulator 81. According to various embodiments, the temperature sensor 401 comprises a thermistor (e.g., a +−1 degree, silicon linear active thermistor). As shown in FIG. 4, the temperature sensor 401 is disposed on the micro-inverter board 61 proximate the micro-inverter 71 and is in communication with the regulator 81 via a data bus in order transmit real-time inverter temperature data to the regulator 81. As can be appreciated from FIG. 4, the temperature sensor 401 is positioned adjacent the micro-inverter 71 on the board 61 and configured to sense the temperature of an area proximate to the micro-inverter 71 and surrounding the temperature sensor 401.

Referring back to FIG. 37, the regulator 81 also receives data from the EMC 170. In the illustrated embodiment, the EMC 170 is configured to receive user input data indicating a user-specified power mode (Maximum Power Point ($W_{MPP}$) mode or Static Max Power ($W_{SET}$) mode); a maximum inverter temperature ($T_{MAX}$); a minimum inverter temperature ($T_{MIN}$); a maximum level of total harmonic distortion ($THD_{MAX}$); and a user-specified minimum total harmonic distortion value ($THD_{MIN}$). As noted above, this data can be provided by a user via an HMI interface on the EMC (e.g., from a user computer 182 or mobile device 184 in communication with the EMC 170). The EMC 170 then transmits this data to the regulator 81 (e.g., via a PLCC connection to the controller 90 as shown in FIG. 31). Upon receiving operational data from the temperature sensor 401 and EMC 170, the regulator 81 stores the data (e.g., in the regulator's memory) for reference in executing steps 304-322 described below.

Next, at step 304, the regulator 81 executes a Maximum Power Point Tracking algorithm to determine the instantaneous maximum power point ($W_{MPP}$) of the solar panel 11. The instantaneous maximum power point ($W_{MPP}$) is the maximum power available theoretically available from the panel 11 according the panel's power curve at a given instant. According to various embodiments, the regulator 81 may execute the Maximum Power Point Tracking algorithm according to the techniques described in the "Grid-Connected Solar Microinverter Reference Design Using a dsPIC® Digital Signal Controller" manual published by Microchip Technology, Inc. for its AN1338 dsPIC microcontroller, the entirety of which is incorporated by reference herein. Upon determining the instantaneous maximum power point ($W_{MPP}$) of the solar panel 11, the regulator stores the instantaneous $W_{MPP}$ value for reference in executing remaining steps 306-322.

Next, at step 306, the regulator 81 determines the power mode the user has specified based on the operational data received from the EMC 170. If the user has selected the Maximum Power Point mode, the regulator 81 moves to step 308. In the Maximum Power Point mode, the regulator 81 is configured to harvest the maximum amount of power available from the solar panel 11 (subject to additional conditions discussed below in relation to steps 314-320). Accordingly, in step 308, the regulator 81 determines the AC current output ($I_{OUT}$) from the micro-inverter 71 that is necessary to extract the instantaneous $W_{MPP}$ value from the solar panel 11. This can be accomplished, for example, by correlating the $W_{MPP}$ value to the panel's I-V curve to determine the inverter current output that would yield the instantaneous $W_{MPP}$ value.

The regulator 81 next adjusts the micro-inverter's AC current output (IOUT) to match the current value correlated to the $W_{MPP}$. In one embodiment, the regulator 81 accomplishes this by generating a pulse width modulated (PWM) signal proportional to the desired current output and transmitting this signal to the micro-inverter 71 in order to control the micro-inverter's power MOSFET (the aforementioned plural switches 71S). The width of the PWM signal correlates to the on-time of the MOSFET (a wider pulse width resulting in a longer on-time and a narrower pulse width resulting in a shorter on-time), and the on-time of the MOSFET in turn correlates to the output current of the micro-inverter 71 (a longer on-time resulting in higher current output and a shorter on-time resulting in lower current output). As such, the regulator 81 determines the appropriate pulse-width for the PWM signal to generate the desired AC current output ($I_{OUT}$) and transmits this PWM signal to the micro-inverter 71. With the output current of the micro-inverter 71 adjusted to the determined $I_{OUT}$ value, the power harvested from the solar panel 11 will equate to $W_{MPP}$.

Turning back to step 306, if the regulator 81 determines that the user has selected the Static Maximum Power mode, the regulator 81 moves to moves to step 310. In the Static Maximum Power mode, the regulator 81 is configured to harvest the maximum amount of power available from the solar panel 11 so long as it does not exceed a static maximum power value ($W_{SET}$) defined by the user (again, subject to additional conditions discussed below in relation to steps 314-320). In this way, the user is enabled to scale back power harvesting from the solar panel 11 from a system maximum ($W_{MPP}$) to any lesser level (e.g., a power value in watts). In essence, the Static Maximum Power mode serves as both a remote off switch (e.g., where $W_{SET}$ is set to 0 watts) and a remote throttle (e.g., where $W_{SET}$ is set to some positive wattage below $W_{MPP}$ to reduce power during time periods where maximum power from the panel 11 is not needed or desired).

Accordingly, in step 310, the regulator compares the instantaneous $W_{MPP}$ value determined in step 304 with user-defined $W_{SET}$ value received from the EMC 170 in step 302. If the $W_{MPP}$ value is less than the $W_{SET}$ value, there is no need to cap the power harvest from the solar panel 11 and so the regulator 81 moves to step 308 in order to harvest the maximum power available from the panel 11. If the $W_{MPP}$ value is greater than the $W_{SET}$ value, the regulator 81 moves to step 312.

In step 312, the regulator 81 determines the AC current output ($I_{OUT}$) from the micro-inverter 71 that is necessary to extract the $W_{SET}$ power value from the solar panel 11 (e.g., by correlating the $W_{SET}$ value to the panel's I-V curve to determine the inverter current output that would yield the $W_{SET}$ value). The regulator 81 then determines the appropriate pulse-width for the PWM signal to generate the desired AC current output ($I_{OUT}$) and transmits this signal to the micro-inverter 71. With the output current of the micro-inverter 71 adjusted to the determined $I_{OUT}$ value, the power harvested from the solar panel 11 will equate to $W_{SET}$.

Following both steps 312 and 308, the regulator 81 next moves to step 314. In step 314, the regulator 81 compares the operating temperature ($T_{INVERTER}$) of the micro-inverter 71 (as indicated by the data received from the temperature sensor 401) with the user-defined maximum inverter temperature ($T_{MAX}$) (as indicated in the operational data received from the EMC 170). According to various embodiments, the $T_{MAX}$ value specified by the user may be a temperature above which damage to the micro-inverter 71, its circuitry, or other associated components is possible. Accordingly, if the micro-inverter temperature $T_{INVERTER}$ is less than the user-specified $T_{MAX}$, the regulator 81 continues on to step 318. However, if the micro-inverter temperature $T_{INVERTER}$ exceeds than the user-specified $T_{MAX}$, the regulator 81 moves to step 316.

At step 316, the regulator 81 executes a temperature-reduction loop in order to throttle back the power harvested from the panel 11 and thereby decrease the operating temperature of the micro-inverter 71 to an acceptable level. In particular, the regulator 81 is configured to decrease the AC current output ($I_{OUT}$) from the micro-inverter 71 in a stepped manner until the temperature of the inverter $T_{INVERTER}$ is less than a user-specified minimum inverter temperature ($T_{MIN}$) (as indicated in the operational data received from the EMC 170). For example, in one embodiment, the regulator 81 is configured to reduce $I_{OUT}$ by providing a 20 watt reduction in power every three seconds (e.g., an 83 milliamp reduction in current at 240 volts) until $T_{INVERTER}$ is less than $T_{MIN}$. Once this occurs, the regulator 81 exits the temperature-reduction loop and proceeds to step 318. In this way, the regulator 81 prevents the micro-inverter 71 from damaging itself by operating above $T_{MAX}$, regardless of the power mode selected by the user. As can be appreciated from the description herein, step 316 can be modified in various embodiments to decrease $I_{OUT}$ until $T_{INVERTER}$ is less than or equal to $T_{MIN}$, or until $T_{INVERTER}$ is simply less than $T_{MAX}$.

Next, at step 318, the regulator 81 compares the total harmonic distortion ($THD_{INVERTER}$) of the AC power being output from the micro-inverter 71 with the user-defined maximum total harmonic distortion ($THD_{MAX}$) (as indicated in the operational data received from the EMC 170). According to various embodiments, the $THD_{MAX}$ value specified by the user may be a maximum acceptable level of total harmonic distortion for the AC power output from the micro-inverter 71 (e.g., 5% in accordance with the IEEE 519 standard or 8% in less demanding environments). In various embodiments, the regulator 81 may be configured to detect the total harmonic distortion of the AC power output by employing a conventional Fast Fourier Transform (FFT) algorithm or by other suitable measurement means. If $THD_{INVERTER}$ is less than the user-specified $THD_{MAX}$, the regulator 81 continues on to step 322. However, if $THD_{INVERTER}$ exceeds the user-specified $THD_{MAX}$, the regulator 81 moves to step 320.

At step 320, the regulator 81 executes a distortion-reduction loop in order to throttle back the power harvested from the panel 11 and thereby decrease the total harmonic distortion of the micro-inverter's 71 AC power output to an acceptable level. In particular, the regulator 81 is configured to decrease the AC current output ($I_{OUT}$) from the micro-inverter 71 in a stepped manner until the total harmonic distortion ($THD_{INVERTER}$) of the micro-inverter output is less than a user-specified minimum total harmonic distortion value ($THD_{MIN}$) (as indicated in the operational data received from the EMC 170). For example, in one embodiment, the regulator 81 is configured to reduce $I_{OUT}$ by providing a 20 watt reduction in power every three seconds (e.g., an 83 milliamp reduction in current at 240 volts) until $THD_{INVERTER}$ is less than $THD_{MIN}$ (e.g., 4%). Once this occurs, the regulator 81 exits the distortion-reduction loop and proceeds to step 322. In this way, the regulator 81 prevents the quality of the power output from micro-inverter 71 from reaching an unacceptable level (above $THD_{MAX}$) regardless of the power mode selected by the user. As can be appreciated from the description herein, step 320 can be modified in various embodiments to decrease $I_{OUT}$ until $THD_{INVERTER}$ is less than or equal to $THD_{MIN}$, or until $THD_{INVERTER}$ is simply less than $THD_{MAX}$.

Next, at step 322, the regulator 81 allows the micro-inverter 71 to continue operation with the current output set to $I_{OUT}$ for a fixed time interval. Depending on the circumstances, the $I_{OUT}$ level would be the $I_{OUT}$ level as adjusted to correlate to $W_{MPP}$ in step 308, the $I_{OUT}$ level as adjusted to correlate to $W_{SET}$ in step 312, the $I_{OUT}$ level at the completion of step 316, or the $I_{OUT}$ level at the completion of step 320. The fixed interval of step 322 can be defined in accordance with a desired frequency of the regulator's operation. As one example, for accurate, continued monitoring of the panel 11 and micro-inverter 71, the time interval for step 322 can be set to 18 microseconds. In other words, such an embodiment of the regulator 81 would effectively check the operational data received from the temperatures sensor 401 and EMC 170, as well as monitor the maximum power point of the panel 11 and total harmonic distortion of the micro-inverter's AC power output, every 18 microseconds. In various embodiments, however, the time interval associated with step 322 can be adjusted according to user preferences and system demands to accommodate any desired operational frequency for the regulator 81.

As will be appreciated from the description herein, the configuration of the regulator 81 enables intelligent, user-customizable control the micro-inverter's energy harvest from its solar panel 11. Indeed, the regulator's ability to actively monitor the operating temperature of the micro-inverter 71 facilitates improved efficiency of the solar panel 11. As noted earlier herein, the micro-inverters 61B-64B are approximately ninety five percent (95%) efficient and, assuming an output of 300 Watts per micro-inverter 61B-

64B, the total heat to be dissipated by the multi-channel micro-inverter enclosure is approximately 60 watts. Given the ability of this excess heat to cause damage to both the micro-inverter 71 and the solar panel 11, it is critical to avoid over-heating of the system. For a micro-inverter capped at a particular maximum wattage for the purpose of avoiding over-heating, the associated solar panel may not be operating at its full potential, particularly on a cool, bright day where more power can be harvested at lower operating temperatures. By contrast, directly monitoring the operating temperature of the micro-inverter 71 and throttling the power harvested from the solar panel 11 based on that temperature feedback enables the presently described system to operate at is maximum potential under any conditions without reaching a dangerous temperature level. Indeed, in many instances, this enables the micro-inverter 71 to operate beyond its conventional power rating.

The system efficiency is similarly improved by the regulator's ability to actively monitor the total harmonic distortion of the of the micro-inverter's AC power output. Rather than passively capping the power harvested by the micro-inverter 71 at a level anticipated to provide acceptable harmonic distortion, the regulator 81 actively monitors the total harmonic distortion of the power output and ensures that maximum power is being harvested from the solar panel 11 within the harmonic distortion constraints defined by the user.

It should be appreciated from the description herein that each of the regulators 81-84 of the micro-inverter boards 61-64 can be configured as described above with respect to the regulator 81, thereby enabling efficient and controlled harvesting of power from each the solar panels 11-14. Likewise, each micro-inverter board 61-64 may be provided with its own temperature sensor 401-404 (e.g., configured identically to the temperature sensor 401 discussed above) for monitoring the operating temperature of the micro-inverters 71-74.

Furthermore, various modifications to the regulator 81 and the associated components of the multi-channel micro-inverter are contemplated as being within the scope of the present invention. For example, in certain embodiments, the regulator 81 may be configured to monitor only temperature or only total harmonic distortion depending on the system requirements for a particular end user. Likewise, various other devices and methods—such as additional processors or additional sensing devices—may be implemented into the system to facilitate detection of the maximum power point of the solar panels, the operating temperature of the micro-inverters, and the total harmonic distortion of the micro-inverter's power output. Moreover, the operating parameters of the regulator 81, such as its operational frequency and the variables discussed herein with respect to steps 302-322 may be adjusted to suit a particular end user or environment.

Although the renewable energy system 7 has been set forth as a single phase 120 volt 60 hertz electrical system, it should be understood that the present invention is suitable for use with other types of electrical systems including 240 volt 50-60 hertz grid systems. In addition, it should be understood that the present invention is suitable for with other types of renewable energy sources such as windmills, water wheels, geothermal and is suitable for with other types energy storages devices such as fuel cells, capacitor banks and the like.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A micro-inverter apparatus configured for converting DC power from one or more photovoltaic cells to AC power, the micro-inverter comprising:
   at least one micro-inverter circuit configured for receiving DC power from the one or more photovoltaic cells and converting the input DC power into output AC power;
   at least one temperature sensor configured for sensing the operating temperature of the micro-inverter circuit; and
   at least one microcontroller in communication with the micro-inverter circuit and the temperature sensor, the microcontroller configured to receive data indicative of a predefined threshold temperature value and regulate the AC power output of the micro-inverter circuit to prevent the micro-inverter circuit from operating at a temperature exceeding the predefined threshold temperature value.

2. The micro-inverter apparatus of claim 1, wherein the temperature sensor comprises a thermistor.

3. The micro-inverter apparatus of claim 1, further comprising a circuit board, wherein the micro-inverter circuit and the temperature sensor are each disposed on the circuit board.

4. The micro-inverter apparatus of claim 3, wherein the temperature sensor is positioned adjacent the micro-inverter circuit on the circuit board and configured for sensing the operating temperature of the micro-inverter circuit by sensing the temperature of an area proximate to the micro-inverter circuit and surrounding the temperature sensor.

5. The micro-inverter apparatus of claim 1, wherein the microcontroller is configured to prevent the micro-inverter circuit from operating at a temperature exceeding the predefined threshold temperature value by:
   monitoring the operating temperature sensed by the temperature sensor and determining when the operating temperature meets or exceeds the predefined threshold temperature value; and
   in response to determining the operating temperature sensed by the temperature sensor meets or exceeds the predefined threshold temperature value, executing a temperature-reduction loop that iteratively decreases the micro-inverter circuit's output current thereby decreasing the micro-inverter circuit's AC power output.

6. The micro-inverter apparatus of claim 5, wherein the microcontroller is further configured for determining when the operating temperature meets or exceeds a predefined minimum temperature value; and
   in response to determining the operating temperature sensed by the temperature sensor meets or is less than the predefined minimum temperature value, increasing the micro-inverter circuit's output current and thereby increasing the micro-inverter's AC power output.

7. The micro-inverter apparatus of claim 6, wherein the microcontroller further comprises a network interface configured for receiving the data indicative of the predefined threshold temperature value from one or more remote data sources.

8. The micro-inverter apparatus of claim 1, wherein the microcontroller is further configured for monitoring the operating temperature sensed by the temperature sensor and determining when the operating temperature is less than the predefined threshold temperature value; and
    in response to determining the operating temperature sensed by the temperature sensor is less than the predefined threshold temperature value, determining the maximum power point of the one or more photovoltaic cells and adjusting the output current to the micro-inverter circuit to correspond to the determined maximum power point.

9. The micro-inverter apparatus of claim 1, wherein the microcontroller is further configured to:
    sense the total harmonic distortion of the micro-inverter circuit's AC power output;
    receive data indicative of a predefined threshold total harmonic distortion value; and
    regulate the AC power output of the micro-inverter circuit to prevent the micro-inverter circuit from producing AC power having a total harmonic distortion that exceeds the predefined threshold total harmonic distortion value.

10. The micro-inverter apparatus of claim 9, wherein the microcontroller is configured to prevent the micro-inverter circuit from producing AC power having a total harmonic distortion that exceeds the predefined threshold total harmonic distortion value by:
    monitoring the total harmonic distortion of the AC power output by the micro-inverter circuit;
    determining when the total harmonic distortion of the micro-inverter circuit's AC power output meets or exceeds the predefined threshold total harmonic distortion value; and
    in response to determining that the total harmonic distortion of the micro-inverter circuit's AC power output meets or exceeds the predefined threshold total harmonic distortion value, decreasing the micro-inverter circuit's output current and thereby decreasing the micro-inverter circuit's AC power output.

11. A micro-inverter apparatus configured for converting DC power from one or more photovoltaic cells to AC power, the micro-inverter comprising:
    at least one micro-inverter circuit configured for receiving DC power from the one or more photovoltaic cells and converting the input DC power into output AC power; and
    at least one microcontroller in communication with the micro-inverter circuit, the microcontroller configured to:
        sense the total harmonic distortion of the micro-inverter circuit's AC power output;
        receive data indicative of a predefined threshold total harmonic distortion value; and
        regulate the AC power output of the micro-inverter circuit by executing a distortion-reduction loop to prevent the micro-inverter circuit from producing AC power having a total harmonic distortion that exceeds the predefined threshold total harmonic distortion value.

12. The micro-inverter apparatus of claim 11, further comprising a circuit board, wherein the micro-inverter circuit and the microcontroller are each disposed on the circuit board.

13. The micro-inverter apparatus of claim 11, wherein the microcontroller further comprises a network interface configured for receiving the data indicative of the predefined threshold total harmonic distortion value from one or more remote data sources.

14. The micro-inverter apparatus of claim 11, wherein the microcontroller is further configured for monitoring the total harmonic distortion of the micro-inverter circuit's AC power output and determining when the sensed total harmonic distortion is less than the predefined threshold total harmonic distortion value; and
    in response to determining the sensed total harmonic distortion is less than the predefined threshold total harmonic distortion value, determining the maximum power point of the one or more photovoltaic cells and adjusting the output current to the micro-inverter circuit to correspond to the determined maximum power point.

15. The micro-inverter apparatus of claim 11, wherein the microcontroller is configured to prevent the micro-inverter circuit from producing AC power having a total harmonic distortion that exceeds the predefined threshold total harmonic distortion value by:
    monitoring the total harmonic distortion of the AC power output by the micro-inverter circuit;
    determining when the total harmonic distortion of the micro-inverter circuit's AC power output meets or exceeds the predefined threshold total harmonic distortion value; and
    in response to determining that the total harmonic distortion of the micro-inverter circuit's AC power output meets or exceeds the predefined threshold total harmonic distortion value, decreasing the micro-inverter circuit's output current and thereby decreasing the micro-inverter circuit's AC power output.

16. The micro-inverter apparatus of claim 5, wherein the temperature-reduction loop comprises decreasing the micro-inverter circuit's output current in a stepped manner, reducing the output current by a predetermined current value at predetermined time intervals until the operating temperature sensed by the temperature sensor is less than the predefined threshold temperature value.

* * * * *